United States Patent
Gunnam et al.

(10) Patent No.: US 10,223,018 B2
(45) Date of Patent: Mar. 5, 2019

(54) BAD PAGE AND BAD BLOCK MANAGEMENT IN MEMORY

(71) Applicant: SanDisk Technologies LLC, Plano, TX (US)

(72) Inventors: Kiran Gunnam, Milpitas, CA (US); Robert Mateescu, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 35 days.

(21) Appl. No.: 15/491,744

(22) Filed: Apr. 19, 2017

(65) Prior Publication Data

US 2018/0307431 A1    Oct. 25, 2018

(51) Int. Cl.
*G06F 3/06* (2006.01)
*G11C 16/10* (2006.01)
(Continued)

(52) U.S. Cl.
CPC .......... *G06F 3/0635* (2013.01); *G06F 3/0619* (2013.01); *G06F 3/0659* (2013.01); *G06F 3/0673* (2013.01); *G06F 17/30097* (2013.01); *G11C 8/06* (2013.01); *G11C 8/14* (2013.01); *G11C 16/08* (2013.01); *G11C 16/10* (2013.01); *G11C 16/26* (2013.01); *G11C 16/3459* (2013.01); *G11C 29/00* (2013.01); *G11C 29/44* (2013.01); *G11C 29/76* (2013.01);
(Continued)

(58) Field of Classification Search
CPC .................................................. G06F 11/1076
USPC ................................ 714/764, 766, 767, 770
See application file for complete search history.

(56) References Cited

U.S. PATENT DOCUMENTS 6,745,354 B2    6/2004  Terzioglu
7,009,896 B2    3/2006  Yoon et al.
(Continued)

FOREIGN PATENT DOCUMENTS

CN    102622306 A    8/2012
CN    103778065 A    5/2014
CN    105740163 A    7/2016

OTHER PUBLICATIONS

English Abstract of Chinese Publication No. CN102622306 published Aug. 1, 2012.
(Continued)

*Primary Examiner* — Fritz Alphonse
(74) *Attorney, Agent, or Firm* — Vierra Magen Marcus LLP

(57) ABSTRACT

The amount of remapping data in a file system of a memory device is reduced. In one aspect, for each request access, e.g., read or write operation, the memory cells of a primary physical address are evaluated. If the evaluation indicates the memory cells are good, the read or write operation proceeds. If the memory cells have a failure such as uncorrectable errors, the primary physical address is hashed to obtain an auxiliary physical address. If the auxiliary physical address is not available, the primary physical address can be hashed again to obtain another auxiliary physical address. In another aspect, per-page remapping is performed until a threshold number of bad pages in a block are detected, after which the entire block is remapped. In another aspect, pages of a block are remapped to auxiliary pages based on a block identifier.

20 Claims, 18 Drawing Sheets

(51) Int. Cl.
   *G11C 16/26* (2006.01)
   *G11C 16/34* (2006.01)
   *G06F 17/30* (2006.01)
   *G11C 8/06* (2006.01)
   *G11C 8/14* (2006.01)
   *G11C 16/08* (2006.01)
   *G11C 29/00* (2006.01)
   *G11C 29/44* (2006.01)
   *G11C 16/04* (2006.01)
   *G11C 29/04* (2006.01)

(52) U.S. Cl.
   CPC .. *G11C 16/0483* (2013.01); *G11C 2029/0409* (2013.01); *G11C 2211/5621* (2013.01)

(56) References Cited

U.S. PATENT DOCUMENTS

| | | | |
|---|---|---|---|
| 7,434,122 | B2 | 10/2008 | Jo |
| 7,603,593 | B2 | 10/2009 | Iaculo et al. |
| 8,239,714 | B2 | 8/2012 | Flynn et al. |
| 8,255,613 | B2 | 8/2012 | Abali et al. |
| 8,341,332 | B2 | 12/2012 | Ma et al. |
| 8,464,024 | B2 | 6/2013 | Makphaibulchoke et al. |
| 8,484,522 | B2 | 7/2013 | Flynn et al. |
| 8,601,331 | B2 | 12/2013 | Nobunaga et al. |
| 8,688,954 | B2 | 4/2014 | Davis |
| 8,769,356 | B2 | 7/2014 | Yu et al. |
| 8,832,507 | B2 | 9/2014 | Post et al. |
| 9,015,425 | B2 | 4/2015 | Flynn et al. |
| 9,348,679 | B2 | 5/2016 | Yoo et al. |
| 9,372,750 | B2 * | 6/2016 | Chun ............... G06F 11/1008 |
| 9,442,840 | B2 * | 9/2016 | Ali ................... G06F 12/0246 |
| 9,857,986 | B2 * | 1/2018 | Fisher ..................... G06F 3/061 |
| 2009/0040827 | A1 | 2/2009 | Kim |
| 2009/0122610 | A1 * | 5/2009 | Danon ................ G11C 11/5628 365/185.08 |
| 2009/0228739 | A1 * | 9/2009 | Cohen ................ G06F 11/1072 714/6.12 |
| 2014/0359382 | A1 | 12/2014 | Choi |
| 2015/0187442 | A1 | 7/2015 | Sivasankaran et al. |

OTHER PUBLICATIONS

English Abstract of Chinese Publication No. CN103778065 published May 7, 2014.

English Abstract of Chinese Publication No. CN105740163 published Jul. 6, 2016.

Micron, "Technical Note: Bad Block Management in NAND Flash Memory," Micron Technology, Inc., Jun. 2006, 4 pages.

* cited by examiner

Fig. 7A

Host file system table, 141

| File name | logical address |
|---|---|
| file 1, sector 0 | 0 |
| file 1, sector 1 | 1 |
| file 1, sector 2 | 2 |
| file 2, sector 0 | 3 |
| file 2, sector 1 | 4 |
| file 2, sector 2 | 5 |
| file 3, sector 0 | 6 |
| file 3, sector 1 | 7 |
| file 3, sector 2 | 8 |
| ... | |

Fig. 7B

Device file system table, 117

| Logical address | Primary block/page physical address | Aux. block/page physical address |
|---|---|---|
| 0 | block p0, page 0 | n/a |
| 1 | block p0, page 1 | n/a |
| 2 | block p0, page 2 | n/a |
| 3 | block p0, page 3 | n/a |
| 4 | block p0, page 4 | block s0, page 0 |
| 5 | block p0, page 5 | n/a |
| 6 | block p0, page 6 | n./a |
| 7 | block p0, page 7 | block s0, page 1 |
| 8 | block p0, page 8 | n/a |
| 9 | block p0, page 9 | n/a |
| ... | | |
| 127 | block p0, page 127 | n/a |

Device file system table, 117a

| Logical address | Primary block physical address |
|---|---|
| 0 | block s0, page 0 |
| 1 | block s0, page 1 |
| 2 | block s0, page 2 |
| 3 | block s0, page 3 |
| 4 | block s0, page 4 |
| 5 | block s0, page 5 |
| 6 | block s0, page 6 |
| 7 | block s0, page 7 |
| 8 | block s0, page 8 |
| 9 | block s0, page 9 |
| ... | |
| 127 | block p0, page 127 |

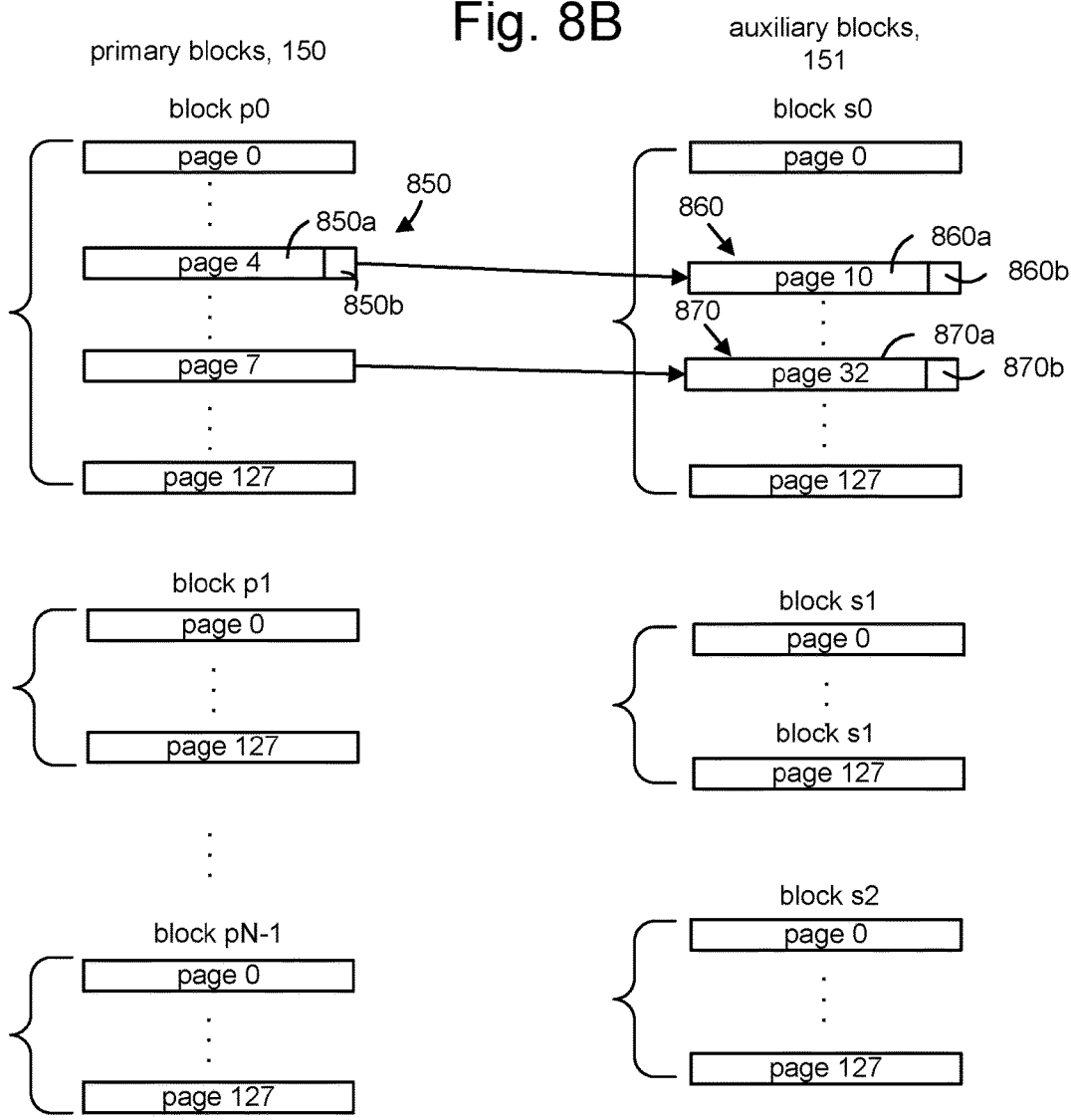

Fig. 9A

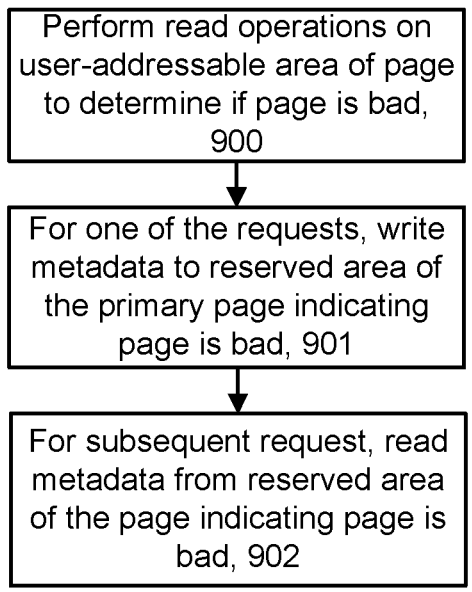

- Perform read operations on user-addressable area of page to determine if page is bad, 900
- For one of the requests, write metadata to reserved area of the primary page indicating page is bad, 901
- For subsequent request, read metadata from reserved area of the page indicating page is bad, 902

Fig. 9B

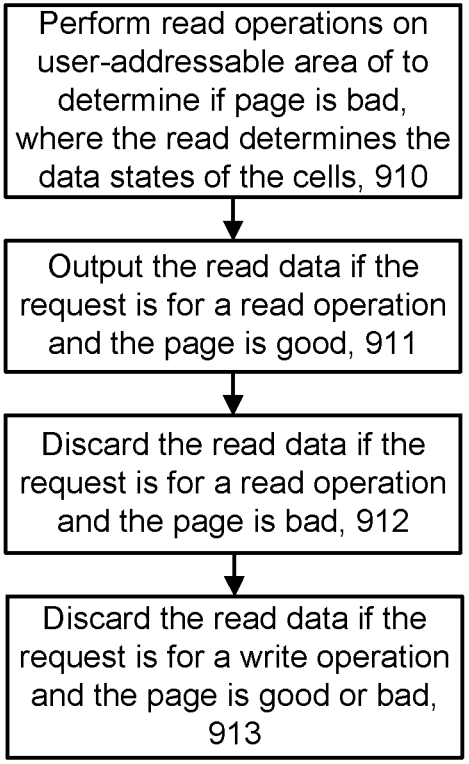

- Perform read operations on user-addressable area of to determine if page is bad, where the read determines the data states of the cells, 910
- Output the read data if the request is for a read operation and the page is good, 911
- Discard the read data if the request is for a read operation and the page is bad, 912
- Discard the read data if the request is for a write operation and the page is good or bad, 913

Fig. 9C

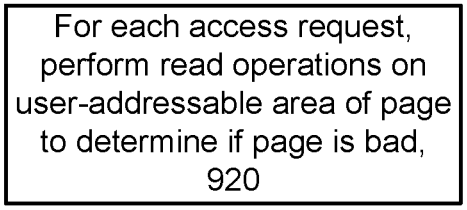

- For each access request, perform read operations on user-addressable area of page to determine if page is bad, 920

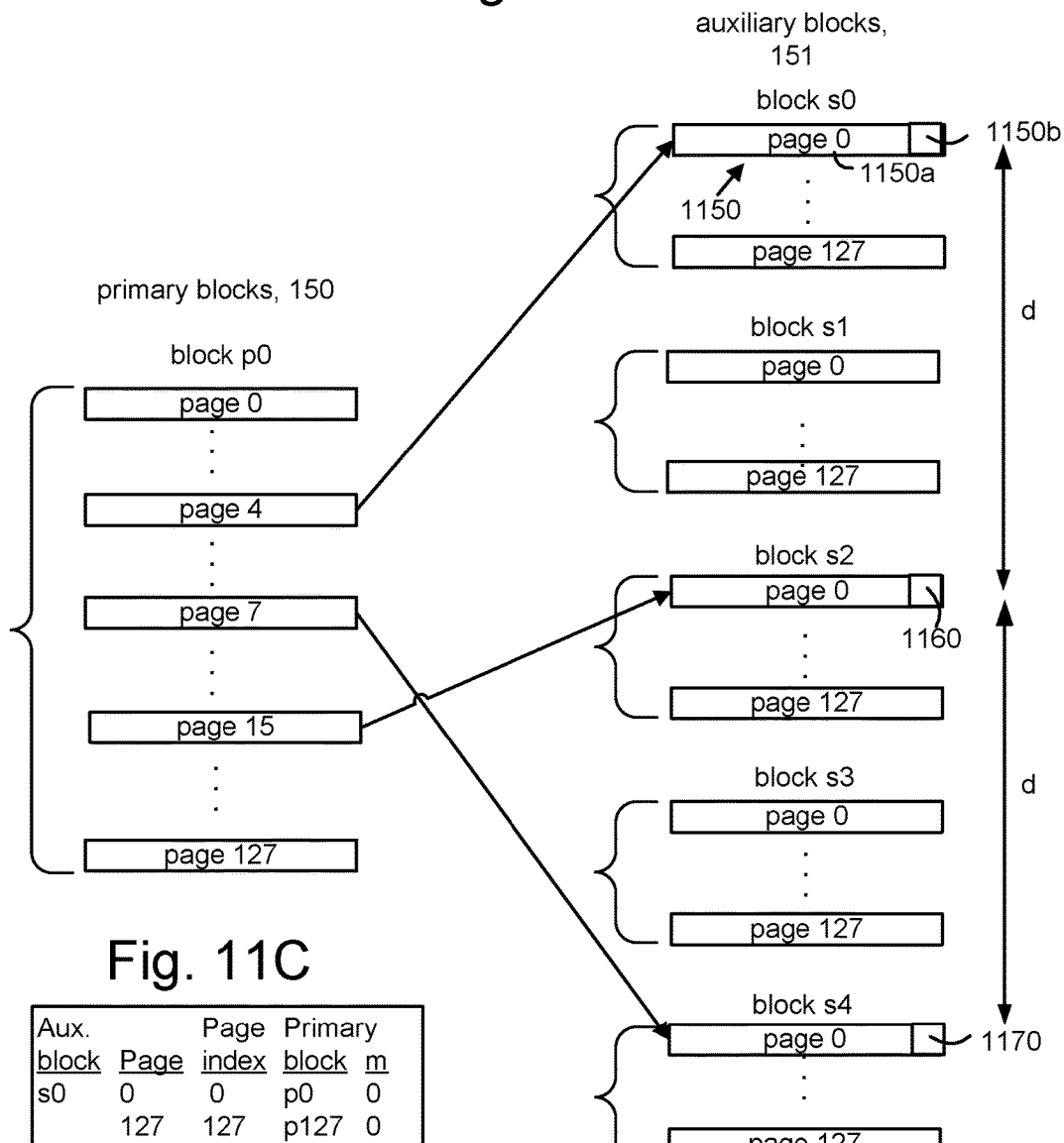

BAD PAGE AND BAD BLOCK MANAGEMENT IN MEMORY

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

Various types of non-volatile memory cells can be used in such memory devices. In one approach, a charge-storing material such as a floating gate or a charge-trapping material can be used in a memory cell to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers. In another approach, a memory cell comprises a resistance-switching material. Other types of non-volatile memory cells can be used as well.

A host device typically communicates with the memory device using a file system. The file system translates logical addresses which are understood by the host to physical addresses in the memory device.

However, various challenges are presented in providing an efficient file system.

BRIEF DESCRIPTION OF THE DRAWINGS

FIG. 7A depicts an example of the file system table 141 of the host in FIG. 1.

FIG. 7B depicts an example of the file system table 117 of the memory device 100 of FIG. 1, where a listing 700 is maintained of auxiliary blocks/pages to which primary blocks/pages are remapped.

FIG. 7C depicts a file system table 117a which is obtained by modifying the file system table 117 of FIG. 7B by remapping block p0 to block s0.

FIG. 8B depicts an example of the remapping of bad primary pages 4 and 7 in a primary block p0 to auxiliary pages 10 and 32, respectively, in an auxiliary block s0, consistent with the process of FIG. 8A.

FIG. 9A depicts an example implementation of step 801 of FIG. 8A in which metadata is written to a primary page indicating the page is bad.

FIG. 9B depicts an example implementation of step 801 of FIG. 8A in which read data from an evaluation of a page is output if a host request is for a read operation and the page is good.

FIG. 9C depicts an example implementation of step 801 of FIG. 8A in which an evaluation process reads data cells of a page in response to each request to access the page.

FIG. 11B depicts an example of the remapping of bad primary pages 4, 7 and 15 in a primary block p1 (having an identifier k=1) to an auxiliary page 1 in each of auxiliary blocks s0, s2 and s4, consistent with steps 1105 and 1106 of the process of FIG. 11A.

FIG. 11C depicts a table showing a correspondence between auxiliary blocks and pages and primary blocks, consistent with steps 1105 and 1106 of the process of FIG. 11A and with FIG. 11B.

DETAILED DESCRIPTION

Figure 1:
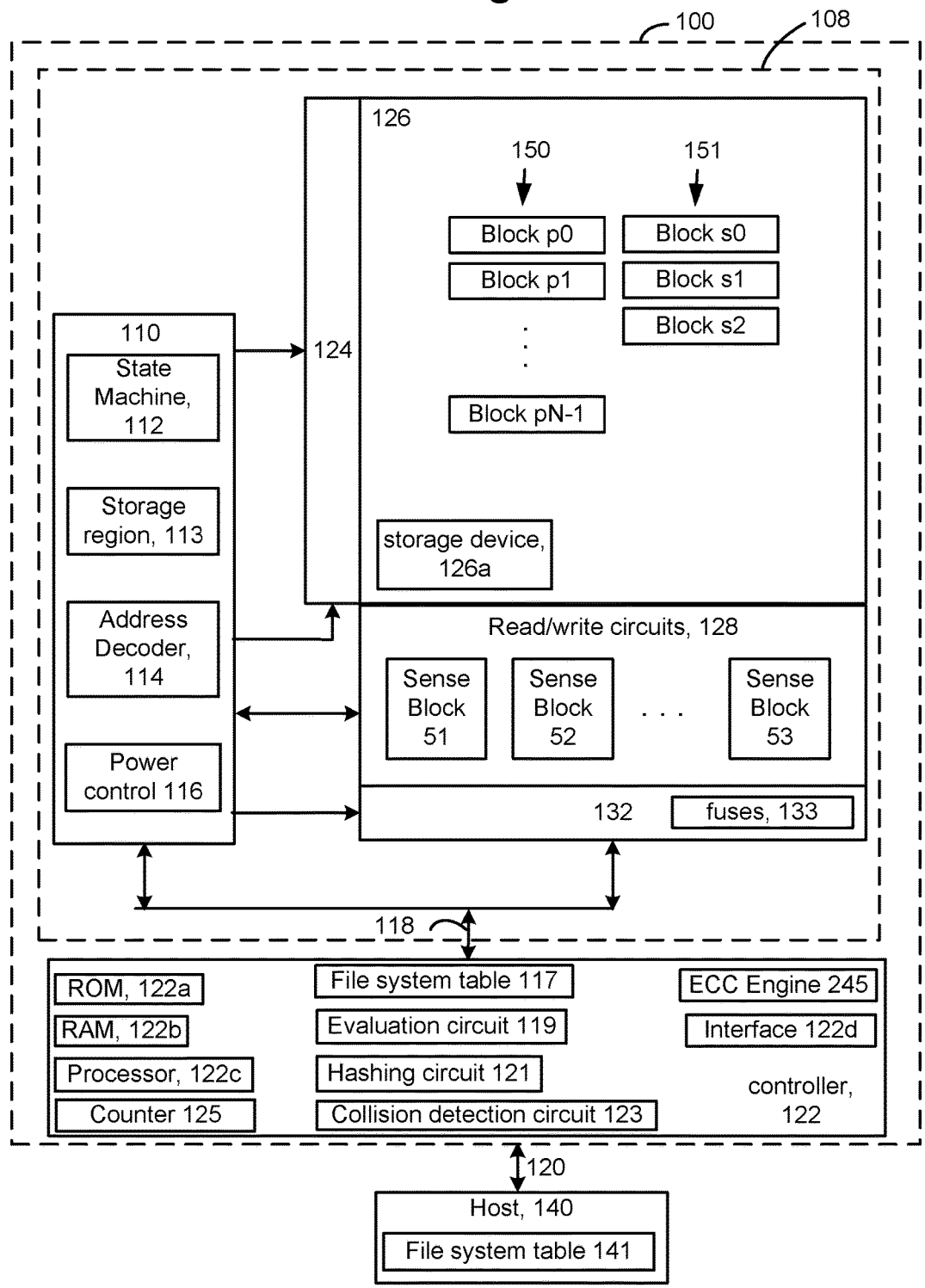
FIG. 1 is a block diagram of an example memory device.

Apparatuses and techniques are described for providing an efficient file system for a memory device.

When a host device reads data from, or writes data to, a memory device, the host device does not know where the data is stored in the memory device. Instead, the data is identified by one or more logical addresses which are mapped to physical or virtual locations, e.g., blocks and word lines within a block, by a file system. A host file system typically includes one or more tables which cross reference files of data to logical block addresses (LBAs). See FIG. 7A. For example, a file may be divided into sectors and may contain, e.g., a video, image, word processing document, application or other data. A memory device file system typically includes one or more tables which cross reference the LBAs to physical block addresses (PBAs) which can include a block identifier and a page identifier, for instance. See FIG. 7B. In some cases, the PBA associated with an LBA can change. For example, a memory device may move data from one physical location to another such as for wear leveling purposes or to consolidate data. A memory device may also move data from a first physical location to a second physical location when the cells of the first physical location are no longer suitable for storing data. This can occur, e.g., when the cells of the first physical location degrade due to the effects of a large number of program-erase cycles and are no longer able to reliably store data.

The memory device can be configured with extra or auxiliary memory cells which are used to store data from physical locations which are no longer suitable for storing data. Such bad memory locations may comprise a small percentage of the memory device, e.g., 1%, but this still results in a significant overhead cost in the file system. The bad memory locations are in a primary storage location of the memory device. When a primary storage location is remapped to an auxiliary storage location, data is stored in the memory device file system to keep track of this remapping. For example, with $2^{32}$ pages of data, a failure rate of 1%, and four bytes allocated to both the original PBA and the auxiliary PBA, the amount of data which is used to keep track of the remapping is about $2^{32} \times 1\% \times 8$ bytes=343 megabytes. Remapping is considered to be a form of mapping.

Moreover, the overhead costs for remapping data is expected to increase as new types of memory are used. For example, the CPU on a chip of a memory device may access data from an off-chip memory such as DRAM which has a very fast access rate but is volatile. The DRAM in turn accesses data from an online storage such as a hard disk drive (HDD). More recently, solid state disks made of NAND flash memory have been used between the DRAM and HDD to provide a non-volatile memory with an access rate between that of DRAM and HDD. Future proposals call for a storage class memory (SCM) in place of the solid state disks. SCM has a very fast access rate as well as high density and can include flash memory or other types of non-volatile memory such as magnetic spin torque transfer memory (spin torque transfer or STT RAM and racetrack memory), phase change RAM (which switches between low-resistance crystalline and high-resistance amorphous phases) and resistive RAM (which can form a conductive filament through an insulating layer).

However, the amount of remapping data will increase as the amount of higher access speed memories are used in a memory device. This increases the cost of the memory device. Moreover, when a volatile memory such as DRAM is used to store remapping data when a memory device is in use, a corresponding non-volatile storage capacity is used to persist the data when the memory device is not in use. This adds to the inefficiency of storing the remapping data. Also, it does not account for issues such as a power failure or other failure which can result in lost user data.

Techniques provided herein address the above and other issues. In one aspect, the overhead storage cost for a file system for a memory device is reduced. One possible implementation involves omitting a listing of auxiliary physical address from the memory device file system table. In one approach, the memory cells of a primary physical address are evaluated before being accessed for a read or write operation. If the evaluation indicates the associated physical location (set of memory cells) is good, the read or write operation proceeds with the memory cells of that location. However, if the evaluation indicates the associated physical location is bad, the primary physical address is hashed to obtain an auxiliary physical address. If the memory cells of the auxiliary physical address are available, it is used in place of the cells of the primary physical address. If the memory cells of the auxiliary physical address are not available, the primary physical address can be hashed again to obtain another auxiliary physical address. Metadata may be stored at the auxiliary physical address to identify a primary physical address mapped to the auxiliary physical address.

In one approach, the primary physical address can be remapped using a hashing circuit each time an attempt is made to access the memory cells of the primary physical address. This avoids the need to store remapping data in the file system table indicating whether the physical addresses have been remapped, and for those which have been remapped, the need to identify the auxiliary physical addresses in the file system table is avoided.

In another possible implementation, metadata is stored in the primary page indicating whether the page is bad.

In another possible implementation, the remapping proceeds on a per-page basis until more than a threshold number of pages are found to be bad. At this time, the entire block is remapped to an auxiliary block. The threshold number can be set at an optimal level based on expected failure rates. Overhead data can be reduced by remapping an entire block when appropriate while avoiding excessive block remapping.

In another possible implementation, remapping metadata is stored in an auxiliary page which is identified by a block identifier. For example, remapping metadata for a kth primary block can be provided in a kth auxiliary page. A bad page of the kth primary block can be remapped to the auxiliary page with the metadata, if that page is available, or to another auxiliary page which is identified by the metadata and/or by the index k.

These and other features are discussed herein.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The host may include a file system table 141 (see, e.g., FIG. 7A). This file system table can map file names to logical addresses according to logic of the host, for instance.

ROM fuses 133 may be used to physically connect auxiliary pages to control lines such as word lines in place of bad primary pages of memory cells.

In one example, the memory structure includes a primary region 150 of memory cells and an auxiliary region 151 of memory cells. The primary region is the first region used to store user data and the auxiliary region is used as a backup to the primary region when portions of the primary region are bad. The primary region includes blocks p0 to pN−1 and the auxiliary region includes blocks s0 to s2, for instance, in this simplified example. Further, each block may be divided into areas referred to as pages. A page is a unit of reading or writing in the memory device. A page may include a set of cells connected to a common control line such as a word line, in one approach.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114 and a power control module 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122*c*, storage devices (memory) such as ROM 122*a* and RAM 122*b* and an error-correction code (ECC) engine 245. The ECC engine can detect and correct a number of read errors. The ECC engine can employ one or more error correcting or error detecting codes, such as a Reed-Solomon code, a Bose, Chaudhuri and Hocquenghem (BCH) code, a cyclic redundancy check (CRC) code, or any other suitable error correcting or detecting code.

A memory interface 122*d* may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122*d*.

The storage device comprises code such as a set of instructions, and the processor is operable to execute the set of instructions to provide the functionality described herein. Alternatively or additionally, the processor can access code from a storage device 126*a* of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122*c* fetches the boot code from the ROM 122*a* or storage device 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

The controller 122 may also include a file system table 117 (see, e.g., FIG. 7B), an evaluation circuit 119, a hashing circuit 121, a collision detection circuit 123 and a counter 125. This file system table can map logical addresses of the host to physical address of the memory device, for instance. For instance, the physical address can identify a block and a page in the block. The evaluation circuit can be used to evaluate a page or other unit of memory cells when there is a request to access the page, such as for a read or write operation. The evaluation can involve reading the cells of the page. See also FIG. 8A at step 801 and 802, FIG. 10A at step 1001 and 1002, and FIG. 11A at step 1101 and 1102.

The hashing circuit can be used to perform one or more hashing operations on a physical address of primary memory cells to obtain a physical address of auxiliary memory cells. See also FIG. 8A at step 804 and 808, FIG. 8B to 8D, and FIG. 10A at step 1006. The collision detection circuit can be used to determine whether an auxiliary page is available for remapping of a bad primary page. See also FIG. 8A at step 805. A collision occurs when an attempt is made to map more than one primary page to an auxiliary page. The counter can count a number of bad pages in a block such as for use in the process of FIG. 10A.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
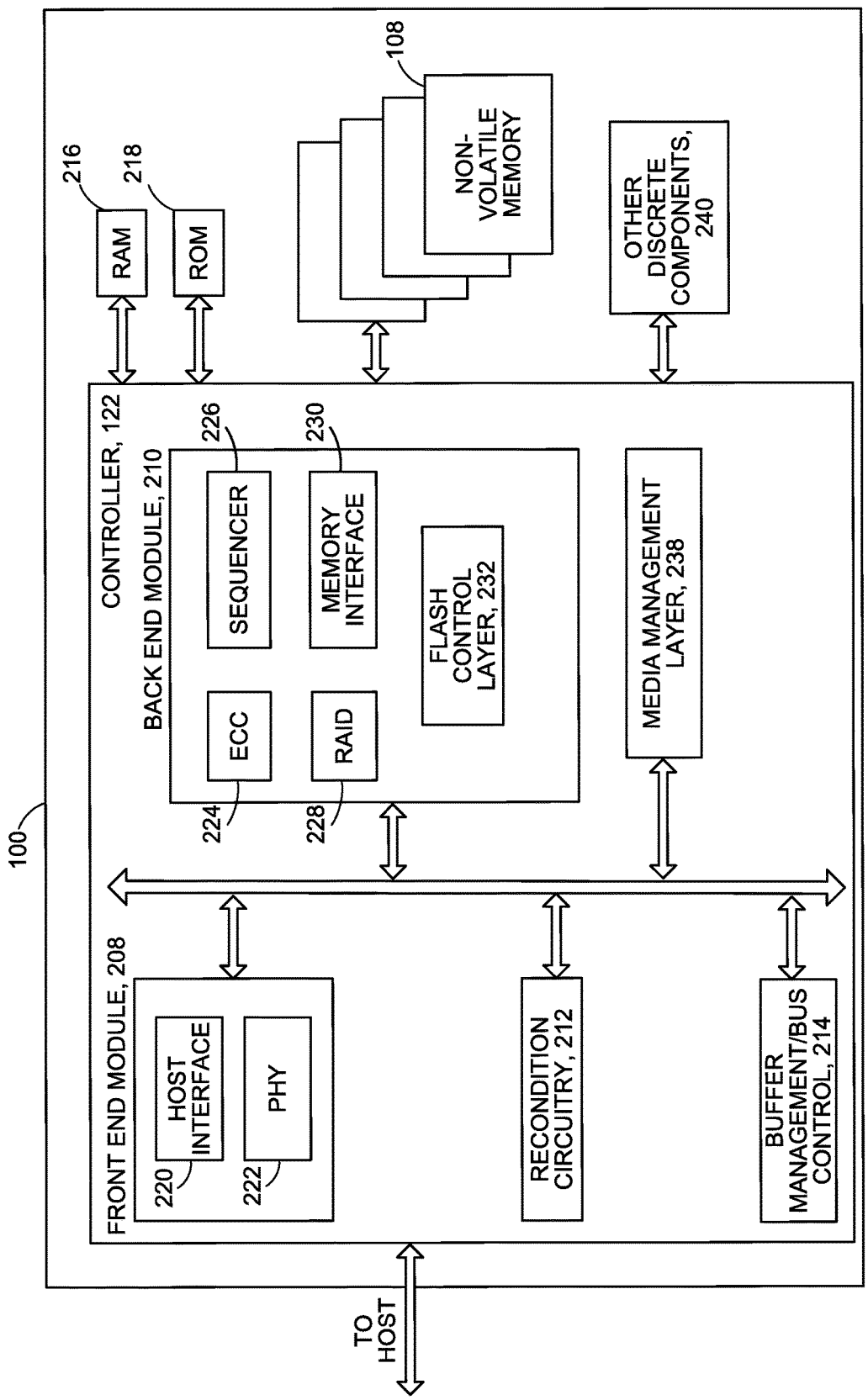
FIG. 2 is a block diagram of the example memory device 100, depicting additional details of the controller 122.

FIG. 2 is a block diagram of the example memory device 100, depicting additional details of the controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate auxiliary memory cells to be substituted for future failed cells. Some part of the auxiliary cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 122 and non-volatile memory die 108 may be any suitable flash interface. In one embodiment, memory device 100 may be a card based system, such as a secure digital (SD) or a micro secure digital (micro-SD) card. In an alternate embodiment, the memory system may be part of an embedded memory system. For example, the flash memory may be embedded within the host, such as in the form of a solid state disk (SSD) drive installed in a personal computer.

In some embodiments, the memory device 100 includes a single channel between the controller 122 and the non-volatile memory die 108, the subject matter described herein is not limited to having a single memory channel.

The controller 122 includes a front end module 208 that interfaces with a host, a back end module 210 that interfaces with the one or more non-volatile memory die 108, and various other modules that perform functions which will now be described in detail.

The components of the controller may take the form of a packaged functional hardware unit (e.g., an electrical circuit) designed for use with other components, a portion of a program code (e.g., software or firmware) executable by a processor, e.g., microprocessor, or processing circuitry that usually performs a particular function of related functions, or a self-contained hardware or software component that interfaces with a larger system, for example. For example, each module may include an Application Specific Integrated Circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for the controller to perform the functions described herein. The architecture depicted in FIG. 2 is one example implementation that may (or may not) use the components of the controller 122 depicted in FIG. 1 (e.g., RAM, ROM, processor, interface).

The controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of Controller 122. The RAM may include DRAM and/or SRAM. DRAM or Dynamic Random Access Memory is a type of semiconductor memory in which the memory is stored in the form of a charge. Each memory cell in a DRAM is made of a transistor and a capacitor. The data is stored in the capacitor. Capacitors loose charge due to leakage and hence DRAMs are volatile devices. To keep the data in the memory, the device must be regularly refreshed. In contrast, SRAM or Static Random Access Memory will retain a value as long as power is supplied.

A read only memory (ROM) 218 stores system boot code. Although illustrated in FIG. 2 as being located separately from the controller, in other embodiments, one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction control (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory device 100. In some cases, the RAID module 228 may be a part of the ECC engine 224. Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from the non-volatile memory die. A flash control layer 232 controls the overall operation of back end module 210.

Additional components of memory device 100 include media management layer 238, which performs wear leveling of memory cells of non-volatile memory die 108. The memory system also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory structure 126, e.g., flash memory, of die 108. The MML 238 may be needed because: 1) the flash memory may have limited endurance; 2) the flash memory may only be written in multiples of pages; and/or 3) the flash memory may not be written unless it is erased as a block. The MML 238 understands these potential limitations of the flash memory which may not be visible to the host. Accordingly, the MML 238 attempts to translate the writes from host into writes into the flash memory. Erratic bits may be identified and recorded using the MML 238. This recording of erratic bits can be used for evaluating the health of blocks and/or word lines (the memory cells on the word lines).

The controller 122 may interface with one or more memory dies 108. In one embodiment, the controller and multiple memory dies (together comprising the memory device 100) implement a solid state drive (SSD), which can emulate, replace or be used instead of a hard disk drive inside a host, as a network-attached storage (NAS) device, and so forth. Additionally, the SSD need not be made to work as a hard drive.

Figure 3:
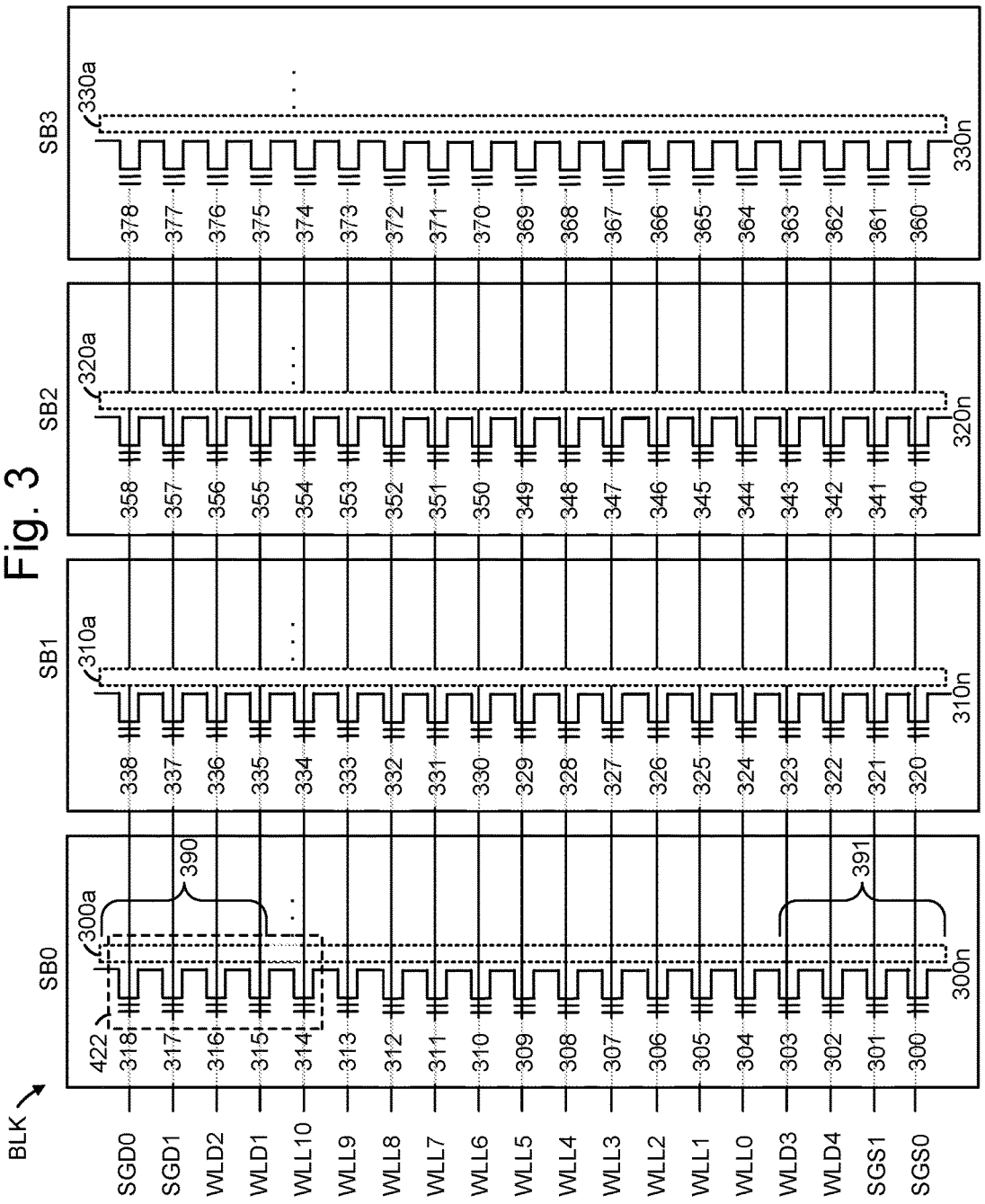
FIG. 3 depicts an example implementation of the memory structure 126 of FIG. 1 comprising NAND strings in sub-blocks in a 3D configuration.

FIG. 3 depicts an example implementation of the memory structure 126 of FIG. 1 comprising NAND strings in sub-blocks in a 3D configuration. In one approach, a block BLK of memory cells is formed from a stack of alternating conductive and dielectric layers. The block comprises conductive layers spaced apart vertically, and the conductive layers spaced apart vertically comprise word lines connected to the memory cells and select gate lines connected to SGD (drain-side select gate) and SGS (source-side select gate) transistors. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Each NAND string may be formed in a memory hole in the stack is filled with materials which form memory cells adjacent to the word lines. A region 422 of the stack is shown in greater detail in FIG. 4.

Further, each block can be divided into sub-blocks and each sub-block includes multiple NAND strings, where one example NAND string is depicted. For example, sub-blocks SB0, SB1, SB2 and SB3 comprise example NAND strings 300n, 310n, 320n and 330n, respectively. The NAND strings have data word lines, dummy word lines and select gate lines. Each sub-block comprises a set of NAND strings which extend in the x direction and which have a common SGD line. The NAND strings 300n, 310n, 320n and 330n are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 300n, 310n, 320n and 330n have channels 300a, 310a, 320a and 330a, respectively. Each channel has a drain end and a source end. For example, the channel 300a has a drain end 390 and a source end 391.

Additionally, NAND string 300n includes SGS transistors 300 and 301, dummy memory cells 302 and 303, data memory cells 304, 305, 306, 307, 308, 309, 310, 311, 312, 313 and 314, dummy memory cells 315 and 316, and SGD transistors 317 and 318.

NAND string 310n includes SGS transistors 320 and 321, dummy memory cells 322 and 323, data memory cells 324, 325, 326, 327, 328, 329, 330, 331, 332, 333 and 334, dummy memory cells 335 and 336, and SGD transistors 337 and 338.

NAND string 320n includes SGS transistors 340 and 341, dummy memory cells 342 and 343, data memory cells 344, 345, 346, 347, 348, 349, 350, 351, 352, 353 and 354, dummy memory cells 355 and 356, and SGD transistors 357 and 358.

NAND string 330n includes SGS transistors 360 and 361, dummy memory cells 362 and 363, data memory cells 364, 365, 366, 367, 368, 369, 370, 371, 372, 373 and 374, dummy memory cells 375 and 376, and SGD transistors 377 and 378.

Figure 4:
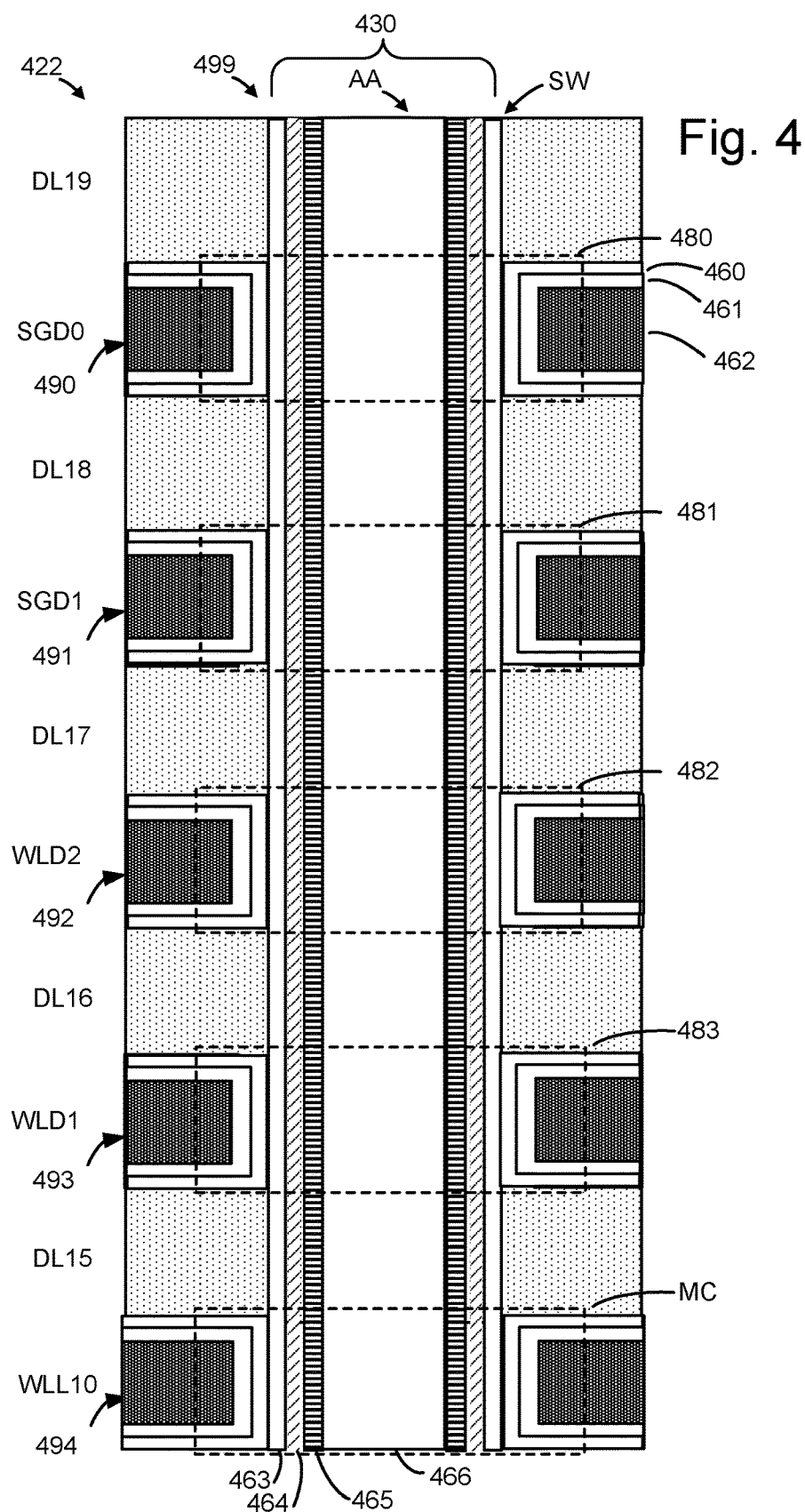
FIG. 4 depicts a close-up view of the region 422 of FIG. 3.

FIG. 4 depicts a close-up view of the region 422 of FIG. 3. Memory cells are formed at the different levels of the stack at the intersection of a word line layer and a memory hole. In this example, SGD transistors 480 and 481 are provided above dummy memory cells 482 and 483 and a data memory cell MC. A number of layers can be deposited along the sidewall (SW) of the memory hole 430 and/or within each word line layer, e.g., using atomic layer deposition. For example, each pillar 499 or column which is formed by the materials within a memory hole can include a charge-trapping layer 463 or film such as silicon nitride ($Si_3N_4$) or other nitride, a tunneling layer 464, a channel 465 (e.g., comprising polysilicon), and a dielectric core 466. A word line layer can include a blocking oxide/block high-k material 460, a metal barrier 461, and a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 5A:
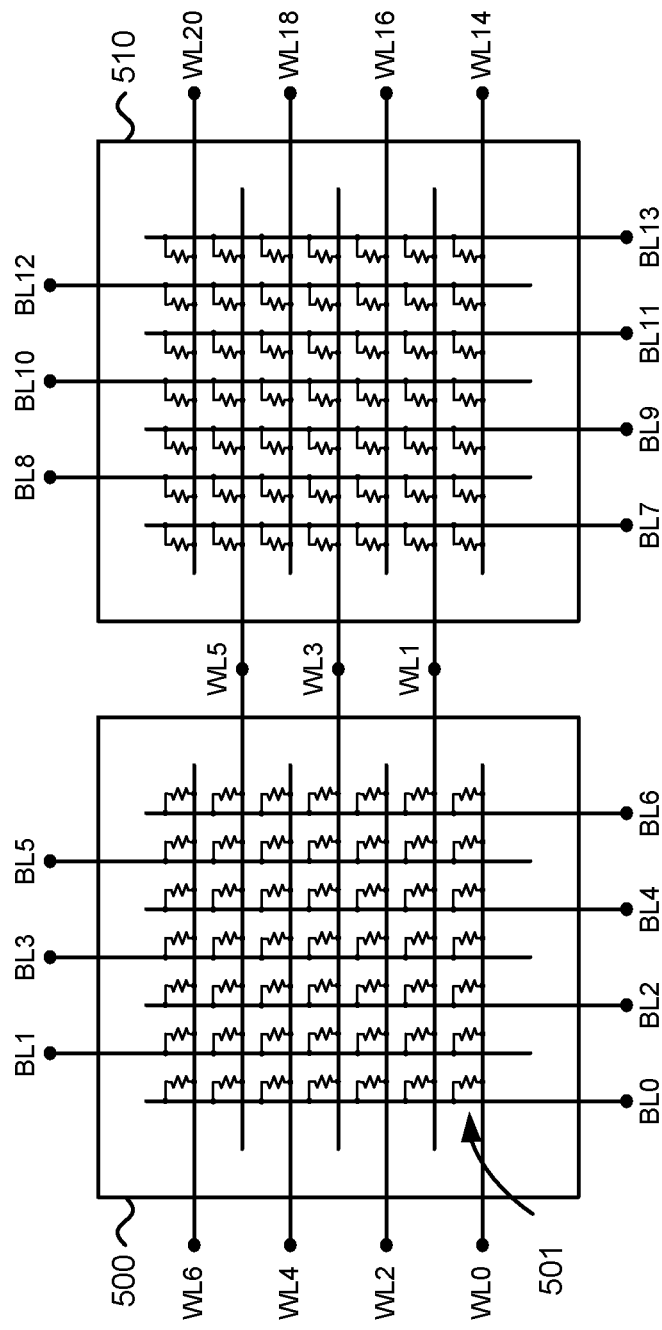
FIG. 5A depicts an example implementation of the memory structure 126 of FIG. 1 comprising resistance-switching memory cells.

FIG. 5A depicts an example implementation of the memory structure 126 of FIG. 1 comprising resistance-switching memory cells. As depicted, word lines WL1, WL3, and WL5 are shared between memory arrays 500 and 510 and controlled by a row decoder. Word lines WL0, WL2, WL4, and WL6 are driven from the left side of memory array 500 and controlled by a row decoder. Word lines WL14, WL16, WL18, and WL20 are driven from the right side of the memory array 510 and controlled by a row decoder. Bit lines BL0, BL2, BL4, and BL6 are driven from the bottom of memory array 500 and controlled by a column decoder. Bit lines BL1, BL3, and BL5 are driven from the top of memory array 500 and controlled by a column decoder.

In one embodiment, the memory arrays 500 and 510 may comprise memory layers that are oriented in a horizontal plane that is horizontal to the supporting substrate. In another embodiment, the memory arrays 500 and 510 may comprise memory layers that are oriented in a vertical plane that is vertical with respect to the supporting substrate (i.e., the vertical plane is perpendicular to the supporting substrate). In this case, the bit lines of the memory arrays may comprise vertical bit lines.

A memory cell is located at the intersection of each word line and bit line. For example, a memory cell 501, depicted by a resistor to denote a resistance switching memory cell, is at the intersection of WL0 and BL0.

Figure 5B:
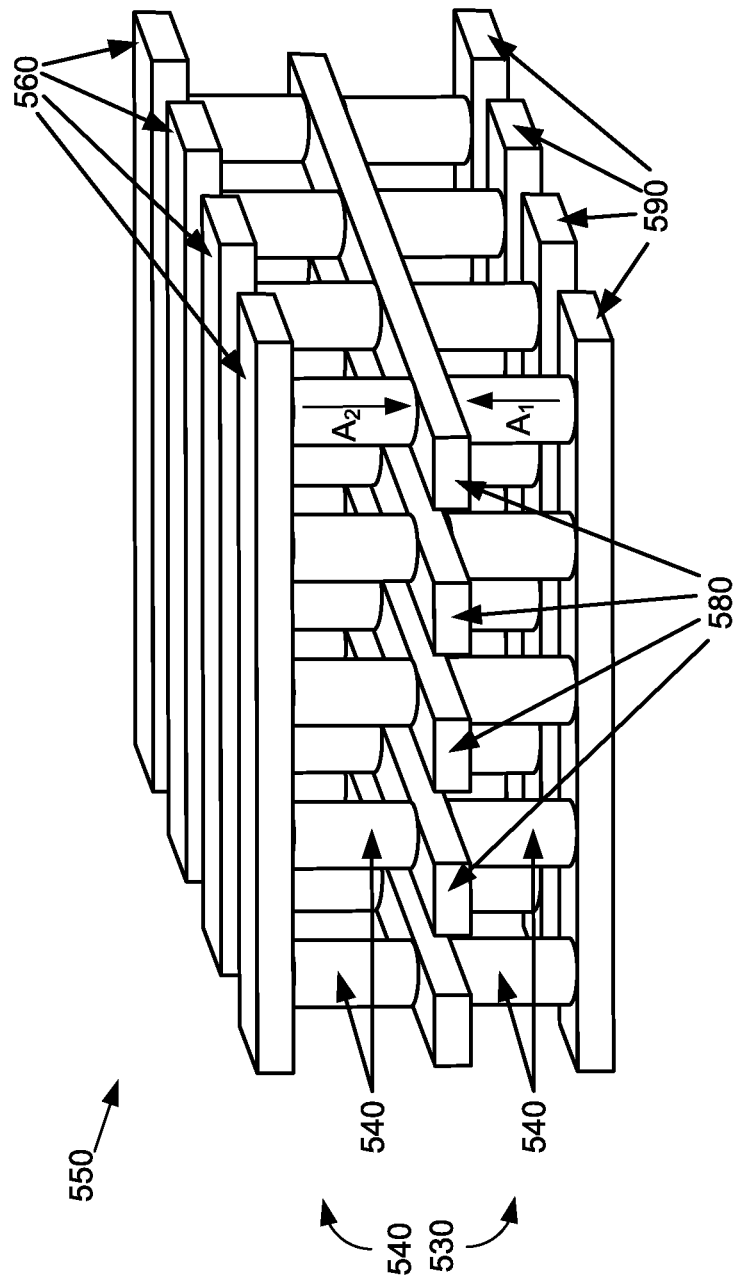
FIG. 5B depicts an example implementation of the memory structure 126 of FIG. 1 comprising a monolithic three-dimensional memory array 550 that includes a second memory level 540 positioned above a first memory level 530.

FIG. 5B depicts an example implementation of the memory structure 126 of FIG. 1 comprising a monolithic three-dimensional memory array 550 that includes a second memory level 540 positioned above a first memory level 530. The bit lines 590 and 560 are arranged in a first direction and the word lines 580 are arranged in a second direction perpendicular to the first direction. As depicted, the upper conductors of first memory level 530 may be used as the lower conductors of the second memory level 540 that is positioned above the first memory level. In a memory array with additional layers of memory cells, there would be corresponding additional layers of bit lines and word lines.

The memory array 550 includes a plurality of memory cells 570. The memory cells 570 may include re-writeable memory cells. The memory cells 570 may include non-volatile memory cells or volatile memory cells. With respect to first memory level 530, a first portion of memory cells 570 are between and connect to bit lines 590 and word lines 580. With respect to second memory level 540, a second portion of memory cells 570 are between and connect to bit lines 560 and word lines 580. In one embodiment, each memory cell includes a steering element (e.g., a diode) and a memory element (i.e., a state change element). In one example, the diodes of the first memory level 530 may be upward pointing diodes as indicated by arrow A1 (e.g., with p regions at the bottom of the diodes), while the diodes of the second memory level 540 may be downward pointing diodes as indicated by arrow A2 (e.g., with n regions at the bottom of the diodes), or vice versa. In another embodiment, each memory cell includes a state change element and does not include a steering element. The absence of a diode (or other steering element) from a memory cell may reduce the process complexity and costs associated with manufacturing a memory array.

In one embodiment, the memory cells 570 may comprise re-writable non-volatile memory cells including a reversible resistance-switching element. A reversible resistance-switching element or memory cell may include a reversible resistivity-switching material having a resistivity that may be reversibly switched between two or more states. In one embodiment, the reversible resistance-switching material may include a barrier layer comprising germanium or silicon germanium and a metal oxide (e.g., a binary metal oxide). The metal oxide may include titanium oxide, nickel oxide, or hafnium oxide. In some cases, the re-writeable non-volatile memory cells may comprise resistive RAM (ReRAM) devices.

In one embodiment of a read operation, the data stored in one of the plurality of memory cells 570 may be read by biasing one of the word lines (i.e., the selected word line) to a selected word line voltage in read mode (e.g., 0 V). A read circuit may then be used to bias a selected bit line connected to the selected memory cell to the selected bit line voltage in read mode (e.g., 1.0 V). In some cases, in order to avoid sensing leakage current from the many unselected word lines to the selected bit line, the unselected word lines may be biased to the same voltage as the selected bit lines (e.g., 1.0 V). To avoid leakage current from the selected word line to the unselected bit lines, the unselected bit lines may be biased to the same voltage as the selected word line (e.g., 0 V); however, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line. The leakage current may be subtracted out by using the auto zero current sensing.

In one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "1" and the low-resistivity state may be associated with binary data "0." In other embodiments, SETTING and RESETTING operations and/or the data encoding may be reversed. For example, the high-resistivity state may be associated with binary data "0" and the low-resistivity state may be associated with binary data "1." In some embodiments, a higher than normal programming voltage may be required the first time a reversible resistance-switching element is SET into the low-resistivity state as the reversible resistance-switching element may have been placed into a resistance state that is higher than the high-resistivity state when fabricated. The term "FORMING" may refer to the setting of a reversible resistance-switching element into a low-resistivity state for the first time after fabrication or the resetting of a reversible resistance-switching element into a high-resistivity state for the first time after fabrication. In some cases, after a FORMING operation or a memory cell preconditioning operation has been performed, the reversible resistance-switching element may be RESET to the high-resistivity state and then SET again to the low-resistivity state.

In one embodiment of a write operation, data may be written to one of the plurality of memory cells 570 by biasing one of the word lines (i.e., the selected word line) to the selected word line voltage in write mode (e.g., 5 V). A write circuit may be used to bias the bit line connected to the selected memory cell to the selected bit line voltage in write mode (e.g., 0 V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 6A:
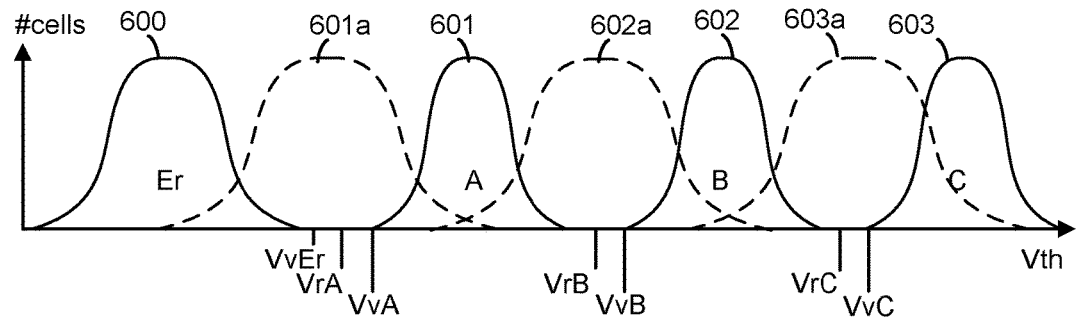
FIG. 6A depicts an example threshold voltage (Vth) distribution of a set of memory cells connected to a word line, showing the effects of charge loss, where four data states are used.

FIG. 6A depicts an example threshold voltage (Vth) distribution of a set of memory cells connected to a word line, showing the effects of charge loss, where four data states are used. A Vth distribution 600 is provided for erased (Er) state memory cells with no program disturb. Three Vth distributions 601, 602 and 603 represent assigned data states A, B and C, respectively, which are reached by memory cells when their Vth exceeds the verify voltage VvA, VvB or VvC, respectively. This example uses four data states. Other numbers of data states can be used as well, such as eight or sixteen. Read voltages VrA, VrB and VrC are used to read data from a set of cells having this Vth distribution. An erase verify voltage VvEr is used in an erase-verify test to determine whether the erase operation is completed.

In one approach, the memory cells store separate pages of data. For example, with four bits per cell as in this example, there will be a lower page and an upper page. The lower page is read using VrA and VrC and the upper page is read using VrB. An example encoding of bits for the Er, A, B and C states is 11, 10, 00 and 01, respectively, in the format of upper page (UP) bit/lower page (LP) bit.

The Vth distributions 601a, 602a and 603a represent the A, B and C state cells with charge loss. The charge loss causes a downshift in the Vth of the cells. When there is a relatively large amount of charge loss, read errors can result. In some cases, there are uncorrectable read errors. For example, an A state cell can be read as being an erased state cell when its Vth<VrA, a B state cell can be read as being an A state cell or even an erased state cell, and a C state cell can similarly be read as being in a lower state. As described further below, the number of read errors or the presence of an uncorrectable read error can indicate that a page of memory cells is bad and should be remapped to an auxiliary page.

Figure 6B:
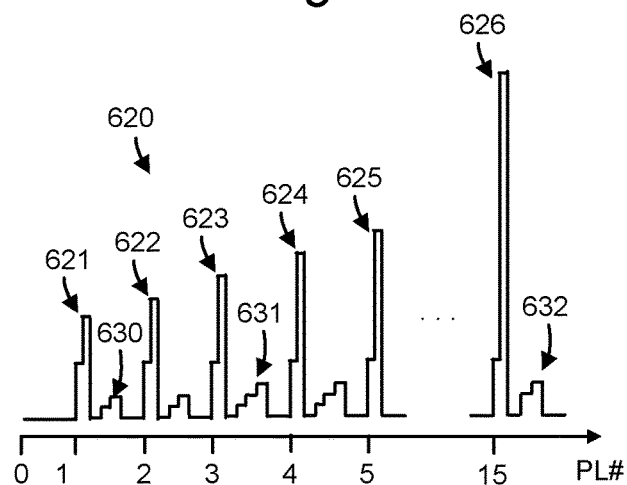
FIG. 6B depicts a waveform of an example programming operation.

FIG. 6B depicts a waveform of an example programming operation. The horizontal axis depicts a program loop (PL) number and the vertical axis depicts control gate or word line voltage. Generally, a programming or writing operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages.

Each program voltage includes two steps, in one approach. Further, Incremental Step Pulse Programming (ISPP) is used in this example, in which the program voltage steps up in each successive program loop using a fixed or varying step size. This example uses ISPP in a single programming pass in which the programming is completed. ISPP can also be used in each programming pass of a multi-pass operation.

The waveform 620 includes a series of program voltages 621, 622, 623, 624, 625, . . . 626 that are applied to a word line selected for programming and to an associated set of non-volatile memory cells. One or more verify voltages can be provided after each program voltage as an example, based on the target data states which are being verified. 0 V may be applied to the selected word line between the program and verify voltages. For example, A- and B-state verify voltages of VvA and VvB, respectively, (waveform 630) may be applied after each of the program voltages 621 and 622. A-, B- and C-state verify voltages of VvA, VvB and VvC (waveform 631) may be applied after each of the program voltages 623 and 624. After additional program loops, B- and C-state verify voltages of VvB and VvC (waveform 632) may be applied after the final program voltage 626.

A programming operation can use one or more programming passes. A one pass programming operation involves one sequence of multiple program-verify operations (or program loops) which are performed starting from an initial Vpgm level and proceeding to a final Vpgm level until the threshold voltages of a set of selected memory cells reach the verify voltages of the assigned data states. All memory cells may initially be in the erased state at the beginning of the programming pass. After the programming pass is completed, the data can be read from the memory cells using read voltages which are between the Vth distributions. At the same time, a read pass voltage, Vpass (e.g., 8-10 V), is applied to the remaining word lines. By testing whether the Vth of a given memory cell is above or below one or more of the read voltages, the system can determine the data state which is represented by a memory cell. These read voltages are demarcation voltages because they demarcate between Vth ranges of different data states.

Figure 6C:
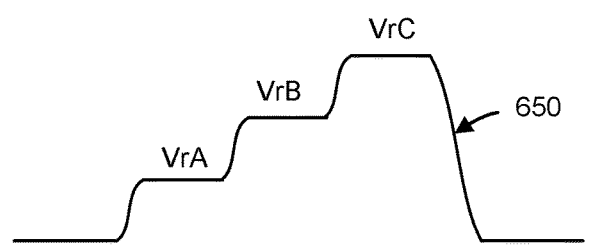
FIG. 6C depicts a waveform of an example read operation.

FIG. 6C depicts a waveform 650 of an example read operation. The waveform includes levels or VrA, VrB and VrC, for instance. Sensing can occur when each of these read voltages is applied to a word line, in one approach. Based on whether a memory cell is in a conductive or non-conductive state when each read voltage is applied, the data state stored in the cell can be determined. For example, if a cell is in a non-conductive state when VrA is applied and in a conductive state when VrB is applied, the cell has a Vth between VrA and VrB and is in the A state. See FIG. 6A. In one approach, the waveform 650 is applied to a page of memory cells as part of a normal read operation. In another approach, the waveform 650 is applied to a page of memory cells as part of the evaluation of the page which is performed before a normal read or write operation. In either case, a sensing of the cells occurs at each read voltage. This sensing involves determining whether each cell is in a conductive or non-conductive state and uses sensing circuitry such as discussed herein.

FIG. 7A depicts an example of the file system table 141 of the host in FIG. 1. When the host reads data from the memory device, the host does not know where the data is stored in the memory device. Instead, the data is identified by one or more logical addresses which are mapped to physical or virtual locations, e.g., block and word lines within the block, by a file system. A host file system includes one or more tables which cross reference files of data to logical block addresses (LBAs). For example, the file may be divided into sectors.

The table includes a column for a file name and a column for a logical address. The file names identifies different files and their sectors. Each sector points to a corresponding logical address. In this simplified example, the logical addresses are consecutive numbers. Also, each file has the same number of sectors. In other cases, the logical addresses are non-consecutive and different files can have different numbers of sectors. The file/sectors and the corresponding logical addresses (LAs) are: file 1, sector 0: LA 0; file 1, sector 1: LA 1; file 1, sector 2: LA 2; file 2, sector 0: LA 3; file 2, sector 1: LA 4; file 2, sector 2: LA 5; file 3, sector 0: LA 6; file 3, sector 1: LA 7; and file 3, sector 2: LA 8.

FIG. 7B depicts an example of the file system table 117 of the memory device 100 of FIG. 1, where a listing 700 is maintained of auxiliary blocks/pages to which primary blocks/pages are remapped. The memory device file system includes one or more tables which cross reference the LBAs to physical or virtual blocks and pages in the memory structure 126. The blocks can include memory cells which store one or more bits of data per cell. There can be a direct or indirect mapping from the LBAs to physical addresses. In an example of direct mapping, the LBA of the host is cross-referenced directly to a physical address. In an example of indirect mapping, the LBA of the host is cross-referenced to a virtual address in the memory device, and the virtual address in the memory device is cross-referenced to a physical address. An address which is mapped to or cross references another address is said to point to the other address.

A first column of the table lists the logical address as in FIG. 7A. A second column of the table lists a primary block/page physical address, e.g., in terms of a block identifier and a page identifier. The memory structure 126 may be divided into a region of primary memory cells comprising primary blocks and primary pages, and a region of auxiliary memory cells comprising auxiliary blocks and auxiliary pages, in one approach. The primary block/page physical addresses are in block p0 as pages 0-127. A third column of the table in the listing 700 lists physical addresses of an auxiliary block/page for the bad primary pages. In this example, block p0, page 4 is remapped to block s0, page 0, and block p0, page 7 is remapped to block s0, page 1. The notation "n/a" indicates not applicable for the primary pages which are good and are therefore not remapped to an auxiliary page. However, data is still needed in the listing to identify this situation. A remapping generally involves providing a correspondence between a primary page or block and auxiliary page or block. This can involve, e.g., involves providing a correspondence between the physical and/or logical address of a primary page or block and the physical and/or logical address of an auxiliary page or block.

As mentioned at the outset, the listing of auxiliary physical addresses consumes a significant amount of space. Some of the techniques provided herein use the table 117 without the listing 700.

FIG. 7C depicts a file system table 117a which is obtained by modifying the file system table 117 of FIG. 7B by remapping block p0 to block s0. FIG. 7B depicts remapping of individual pages in the block p0, e.g., remapping on a per-page basis. In contrast, the table 117a depicts remapping of a block, e.g., on a block basis. In this case, the physical address of an auxiliary block s0 and its pages 0-127 replace the physical address of the primary block p0 and its pages 0-127. A file system table with per-block remapping can be provided in place of, or in addition to, a file system table with per-page remapping.

Figure 8A:
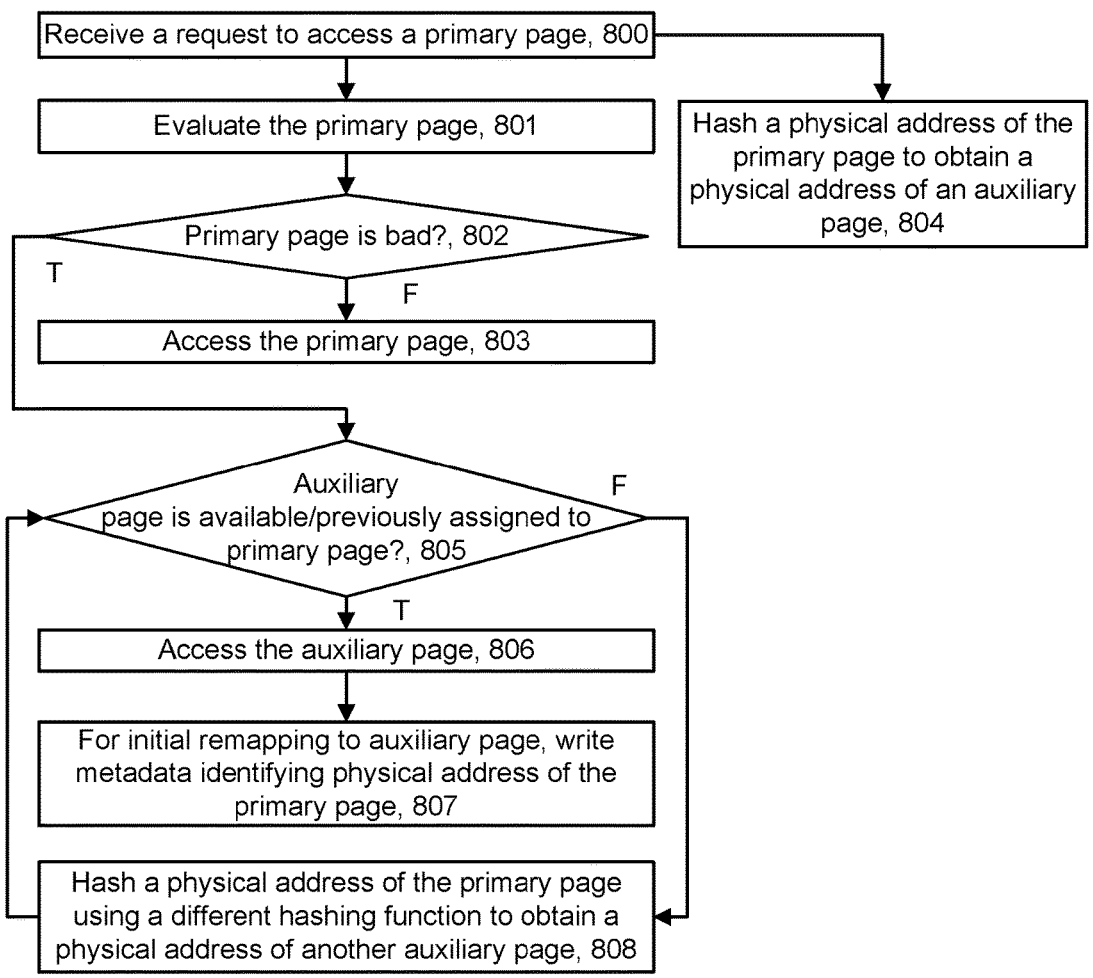
FIG. 8A depicts an example process for remapping a bad primary page to an auxiliary page using a hash function.

FIG. 8A depicts an example process for remapping a bad primary page to an auxiliary page using a hash function. Step 800 includes receiving a request to access a primary page. In one embodiment, a set of primary pages of memory cells and a set of auxiliary pages of memory cells are in a non-volatile, storage class memory medium. In one approach, the controller of the memory device receives the request from a host device. Step 801 includes evaluating the primary page to determine whether the primary page is good or bad. For example, the evaluation circuit 119 can read a user-addressable area of the primary page. In another approach, the evaluation circuit 119 can read metadata in a reserved area of the primary page.

Various approaches can be used to evaluate a page. An evaluation can involve reading or otherwise sensing memory cells in the page. In one approach, the evaluation can involve applying the same waveform to the memory cells as the normal read operation. The waveform 650 of FIG. 6C is one example. In another approach, the evaluation can involve applying a different waveform to the memory cells than the normal read operation. For example, the waveform used for evaluation can have more voltage levels, or fewer voltage levels than the waveform of the normal read operation. The evaluation can involve sense operation, a sense pulse, a normal read operation, a read with or without error detection, and so forth. The evaluation can involve sensing an amount of current in the cells. The evaluation of a primary page such as in step 801 can be separate from a normal read operation which is requested by a host device and which is used to determine the data state of cells in a page such as in step 803, in one approach. In another approach, the evaluation encompasses a normal read operation which is requested by a host device so that a separate read operation is no performed. The evaluation is also separate from a requested write operation of the host device, in one approach. See FIG. 9A to 9C for further details.

One approach of the evaluation determines a raw bit error rate or number of errors from reading the cells. Data in the page can be stored using an error correction code which determines the raw bit error rate or number of errors. This is the number of errors before error correction is applied. A page may be bad if the number of raw errors in data read from the page exceeds a threshold. Another approach is to determine a number of uncorrectable errors, e.g., after the error correction is applied. A page may be bad if the number of uncorrectable errors in data read from the page exceeds a threshold. For example, the presence of one or more uncorrectable errors may be sufficient to classify a page as being bad.

In another approach, a page is bad if it does not contain a predetermined bit sequence in the reserved area. For instance, in the page 880 of FIG. 8E, the reserved area may include several bytes of data. A specified byte in this area may store all 1's, having a hexadecimal value of FFh, when the cells are good and are able to retain data. The page may be classified as being bad if the evaluation does not detect this predetermined bit sequence. In some cases, pages are bad at the time of manufacture, before the memory device is provided to the end user. In other cases, pages are classified as being bad after being provided to the end user. As mentioned, a page of cells may become bad over time due to degradation. Bad cells lose the ability to be programmed and retain charges.

Another approach of the evaluation is to read metadata which was previously written based on a previous evaluation of the page. This metadata may indicate the page is bad so that the evaluation does not have to proceed with sensing of the page to determine if it is bad. This metadata may stored in the reserved area of the page or at another location. See reserved area 850b of page 850 in FIG. 8B, for an example.

If the primary page is good, decision step 802 is false, and step 803 involves accessing the primary page, e.g., for a normal read or write operation which is requested by the host device. In one embodiment, step 803 is omitted if the evaluation operation determines data states of the cells and the requested access is a read operation. Or, step 803 may include a read operation for the page if the requested access is a read operation, and if the evaluation operation did not determine the data state of the cells, or the evaluation operation did determine the data states of the cells but did not save the resulting read data.

Step 804 may occur in parallel (concurrently) with step 801 to reduce delays. Thus, the controller can start the computation of the hash function associated with a primary page address and does not have to wait to find out if the primary page is good or bad. If the page is bad, the hashing computation will already be completed so that additional time is not needed to perform the computation of the address of the auxiliary page after determining that the primary page is bad. If the page is good, the result of the hashing computation can be discarded, or saved until a next hashing computation is made.

Step 804 involves hashing a physical address of the primary page to obtain a physical address of an auxiliary page. The hashing circuit 121 may be used for this purpose. The hashing circuit implements one or more hashing functions. A hashing circuit receives an input value and calculates an output value. The input and output values can each be an address in the forms of a set of bits, or one or more byte, for instance. In one approach, the output value has a defined range. For example, the output value may encompass the range of pages in one or more blocks. For instance, there may be 128 pages in a block so that the output value is a 7-bit number to encompass one block. For a range which encompasses two blocks and 256 pages, the output value may be an 8-bit number. A hash function may have the property that multiple inputs can result in the same output, so that there is the possibility of a collision. A collision or conflict occurs when one primary physical address is mapped to the same auxiliary physical address that is already in use for remapping of another primary physical address. Collisions are possible because the hashing is many-to-one. That is, multiple input values can be hashed to the same output value.

The input to a hashing circuit may be a physical address in the primary region of the memory device in the form of a bit string or a string of one or more bytes, and the output may be a physical address in the auxiliary region of the memory device in the form of a bit string or a string of one or more bytes. The hashing circuit can perform calculations or other operations such as exclusive or (XOR) operations and shifting operations to produce an output in a desired range. The hashing function can be implemented in hardware, for instance, so that it is very fast and can provide an output in a small number of clock cycles. The hashing function can include a mapping operation, an operation that reads an index, a look up operation, and so forth.

As a specific example, assume there are $2^{32}$ primary pages in total, and a failure rate of 1%, so that there are about $2^{25}$ to $2^{26}$ pages to be remapped. This is the required number of auxiliary pages. Assume also that the memory device uses 33 bits to address the auxiliary pages. The hash functions can then be designed so that their outputs map differently to the same auxiliary space. The auxiliary capacity can be allocated dynamically without any pre-allocations. This approach is space efficient but may lead to a longer latency. Another approach is to allocate a dedicated auxiliary space in decreasing order of size for the higher order hash functions. This will improve the latency by reducing the number of collisions of mapped outputs of different hash functions.

If the primary page is bad at a decision step 802, decision step 805 is reached. The decision step 805 determines if the auxiliary page which is identified by the hashing is available and/or was previously assigned to the bad primary page. In one approach, the auxiliary page may comprise metadata which indicates whether it has been allocated to a particular bad primary page. The controller can read this metadata. If the metadata indicates that the auxiliary page has not yet been allocated to any bad primary page, or that the auxiliary page was previously allocated to the particular bad primary page which is currently being remapped, the auxiliary page is available, and decision step 806 includes accessing the auxiliary page. The auxiliary page can also be read and evaluated to determine if it is bad, similar to step 802. The auxiliary page is accessed if it is good. If it is bad, another auxiliary page is located by proceeding to step 808, for instance. Optionally, non-volatile data is stored which identifies the bad auxiliary pages.

Various scenarios are possible. In one scenario, the primary page is determined to be bad for the first time. See FIG. 12A. In another scenario, the primary page was determined to be bad during a previous request to access the memory device for a red or write operation. See FIG. 12B for further details. For the initial remapping to the auxiliary page, step 807 includes writing metadata identifying the physical address of the primary page. For example, this can be written to a reserved area of the auxiliary page. See page 860 with reserved area 860*b* in FIG. 8B, as an example. See also FIG. 8E. In one approach, the auxiliary pages and blocks are contiguous in the memory device.

If decision step 805 is false, the auxiliary page is not available and step 808 includes hashing the physical address of the primary page using a different hash function than in step 804 to obtain a physical address of another auxiliary page. This can be considered a re-hashing of the physical address of the primary page. In one approach, the different hashing function (a second function) has a same range of output values as the first hashing function of step 804. In this case, the first and second hashing functions map to a same set of physical addresses in the set of auxiliary pages.

After step 808, the decision step 805 is reached again. If the auxiliary page is bad or unavailable, another hashing operation can occur at step 808. If the auxiliary page is good and available, it is accessed at step 806.

In one embodiment, an evaluation circuit determines that a particular primary page (e.g., page 0 in block p0) is bad, and in response, a hashing circuit hashes a physical address of the particular primary page to obtain a physical address of a particular auxiliary page (e.g., page 56 in block s0) in the set of auxiliary pages. Further, a collision detection control circuit is configured to determine whether another primary page (e.g., page 77 in block p0) of a set of primary pages is mapped to the particular auxiliary page, wherein the hashing circuit, in response to the collision circuit determining that the another primary page of the set of primary pages is mapped to the particular auxiliary page, is configured to re-hash the physical address of the particular primary page to obtain a physical address of another auxiliary page (e.g., page 89 in block s0) in the set of auxiliary pages.

An option for step 808 is to store metadata in each auxiliary page which identifies a another auxiliary page which the controller can evaluate to determine if it is available.

There is a small chance that the primary page is again mapped to the same auxiliary page, in which case the hashing can be repeated again. Most likely, however, the primary page is mapped to another auxiliary page. If the auxiliary page is available, it can be used for remapping of the primary page. Otherwise, the hashing can be repeated again.

In another approach, the second hashing function has a different range of output value than the first hashing function. This avoids the primary page being mapped to the same auxiliary page as in the previous hashing iteration. For instance, the range of output values of the first hashing function can encompass a first set of one or more block or portions of blocks, and the range of output values of the second hashing function can encompass a different second set of one or more block or portions of blocks. Also, the range of output values of the second hashing function can be smaller than the range of output values of the first hashing function. This is advantageous because it provides efficient use of the auxiliary pages. The first hashing function is likelihood to provide different outputs in its range of output values so that the second hashing function is not frequently used. It therefore is efficient to allocate a smaller number of auxiliary pages to the range of the second hashing function than to the first hashing function.

In one approach, the hashing function (step 804) used in the hash of the physical address of the particular primary page maps to one set of physical addresses in the set of auxiliary pages; and the hashing function (step 808) used in the re-hash of the physical address of the particular primary page maps to another set of physical addresses in the set of auxiliary pages and has a smaller range of output values than a range of output values of the first hash function.

It is possible to provide additional (e.g., third, fourth . . . ) hashing functions as well for hashing of the physical address of the primary page to locate an available auxiliary page to which the primary page can be remapped. The number of hashing iterations should be limited, e.g., to two to three, and is a function of the size of the auxiliary area. The larger the size of the auxiliary area, the less likelihood for collisions and the smaller the number of hashing iterations. In one approach, the auxiliary area is 2% of the primary area when an expected page failure rate is 1%.

In a further option, different areas of the primary memory have different expected failure rates. In this case, the size of the corresponding auxiliary area can be made larger for areas which are expected to have a higher failure rate. For example, assume a first half of the primary blocks has an expected failure rate of 1% and a second half of the primary blocks has an expected failure rate of 2%. The number of auxiliary blocks allocated to the second half can therefore be larger, e.g. twice as large, as the number of auxiliary blocks allocated to the first half. It is also possible to use a smaller block size (smaller number of pages) for memory regions in which the expected failure rate is higher. This results in fewer pages being invalidated in case an entire block is remapped, as in FIG. 10A.

A hash function may be configured so that a given physical address is mapped to the same auxiliary address when the hash is repeated. This ensure that data which is remapped from a particular primary page to a particular auxiliary page can be repeatedly accessed based on the same logical address.

The remapping techniques described herein can be used after employing ROM fuses, if available, which physically connect auxiliary pages to control lines such as word lines in place of bad primary pages of memory cells.

In one approach, a primary page is evaluated and the determination of whether the primary page is bad is performed for each access request for the primary page. In an example process, a method includes, in response to a first request to access one primary page (e.g., page 850 in FIG. 8B) in a block of pages, evaluating the one primary page to determine that the one primary page is bad and, in response to the determining that the one primary page is bad, remapping a physical address of the one bad page to a physical address of one auxiliary page (e.g., page 860 in FIG. 8B), the remapping comprises storing metadata in one auxiliary page (e.g., in reserved area 860*b*) which identifies the physical address of the one primary page, and accessing the one auxiliary page.

The method further includes, in response to a subsequent request to access the one primary page, evaluating the one primary page to again determine that the one primary page is bad; and in response to the again determining that the one primary page is bad, hashing the physical address of the one bad page to obtain the physical address of one auxiliary page.

FIG. 8B depicts an example of the remapping of bad primary pages 4 and 7 in a primary block p0 to auxiliary pages 10 and 32, respectively, in an auxiliary block s0, consistent with the process of FIG. 8A. The primary blocks include p0, p1, pN−1 and the auxiliary blocks include s0 to s2, in this example. Each block includes 128 pages, as an example (page 0 to page 127). The number of auxiliary blocks is much less than the number of primary blocks. For example, it can be 1-2% of the number of primary blocks. This is based on an assumption that about 1% of the primary blocks will become bad over a lifetime of the memory device such as five years. Page 4 (850) and page 7 in p0 are bad and are mapped to page 10 (860) and page 32, respectively, in s0. The page 850 has a user-addressable area 850a and a reserved area 850b. In one approach, as mentioned, metadata can be written to, and stored in, the reserved area 850b to indicate the page is bad. In theory, metadata can be written that indicates the page has been found to be good. However, the status of the page could change from good to bad over time so that such metadata is no longer valid. One approach is to write metadata when the page is good but to periodically re-evaluate the page using a read operation.

Page 10 includes a user-addressable area 860a and a reserved area 860b. See also FIG. 8E. The controller can write metadata such as the physical address of block p0, page 4, or some other identifier of this block and page, to the reserved area 860b to indicate that page 10 is used for remapping of block p0, page 4. Similarly, page 32 (870) includes a user-addressable area 870a and a reserved area 870b. The controller can write metadata such as the physical address of block p0, page 7 to the reserved area 870b to indicate that page 32 is used for remapping of block p0, page 7. In this example, the bad pages of one primary block, block p0, are mapped to pages of one auxiliary block, block s0. In other cases, the bad pages of one primary block can be are mapped to pages of different auxiliary blocks.

The controller can also write metadata to the reserved area 860b indicating the page 860 is bad, if that is the case.

Figure 8C:
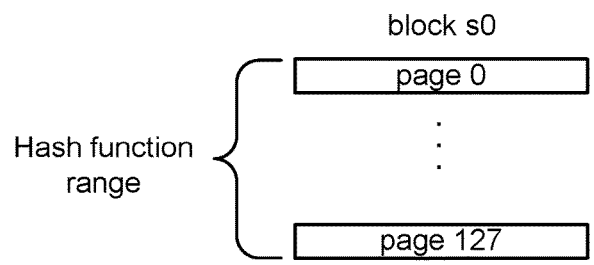
FIG. 8C depicts a hash function which maps to one set of pages in an auxiliary block, as one example of step 804 and 808 of FIG. 8A.

FIG. 8C depicts a hash function which maps to one set of pages in an auxiliary block, as one example of step 804 and 808 of FIG. 8A. The hash function has a range of output values which span the entirety of block s0, e.g., page 0 to page 127. It is also possible to have a range of output values which spans multiple auxiliary blocks.

Figure 8D:
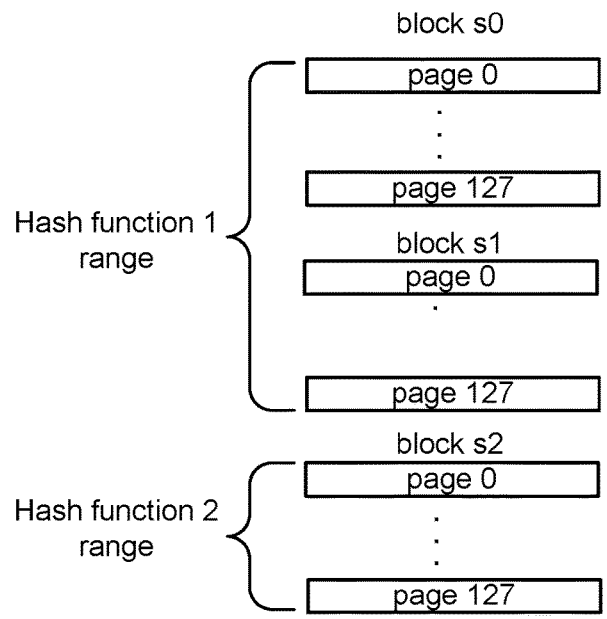
FIG. 8D depicts hash functions which map to different respective sets of pages in different auxiliary blocks, as another example of step 808 of FIG. 8A.

FIG. 8D depicts hash functions which map to different respective sets of pages in different auxiliary blocks, as another example of step 808 of FIG. 8A. The first hash function maps to auxiliary blocks s0 and s1, and the second hash function maps to auxiliary block s2. This shows how the first hash function has a larger range of output values (e.g., a range of 256 pages) than the second hash function (e.g., a range of 128 pages).

Figure 8E:
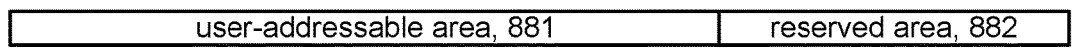
FIG. 8E depicts an example arrangement of a page 880 of data, showing a user-addressable area 881 and a reserved area 882.

FIG. 8E depicts an example arrangement of a page 880 of data, showing a user-addressable area 881 and a reserved area 882. As mentioned, one or more bytes can be reserved in an auxiliary page of data for information such as metadata which identifies a primary page which has been mapped to the auxiliary page. The remainder of the page can be used for storing user data. This can be data provided by the host in a write operation or provided to the host in a read operation. In one approach, the length of the page is 2048 bytes. The metadata can also identify another auxiliary page to use if the auxiliary page 880 is not available. See, e.g., FIG. 11. The page 880 could also represent a primary page. In this case, the reserved area 882 could include metadata which indicate whether the page is good or bad. The reserved area could also include an area which includes a predetermined bit sequence when the page is good, as discussed.

FIG. 9A depicts an example implementation of step 801 of FIG. 8A in which metadata is written to a primary page indicating the page is bad. Step 900 includes performing read operations on the user-addressable area of the primary page to determine if the page is bad. At step 901, for one of the requests, e.g., from the host, the process includes writing metadata to the primary page, e.g., in the reserved area, indicating the page is bad. At step 902, for subsequent requests, the process includes reading the metadata from the reserved area of the page indicating the page is bad. This is done without performing read operations on the user-addressable area of the primary page, in one approach.

FIG. 9B depicts an example implementation of step 801 of FIG. 8A in which read data from an evaluation of a page is output if a host request is for a read operation and the page is good. Step 910 includes performing read operations on the user-addressable area of the page to determine if the page is bad. Step 911 includes outputting the read data if the request is for a read operation and the page is good. For example, the read data can identify the data states of the cells and be output from the memory device controller to the host device. Step 912 includes discarding the read data if the request is for a read operation and the page is bad. Step 913 includes discarding the read data if the request is for a write operation and the page is good or bad.

FIG. 9C depicts an example implementation of step 801 of FIG. 8A in which an evaluation process reads data cells of a page in response to each request to access the page. At step 920, for each access request, the process performs read operations on the user-addressable area of the page to determine if the page is bad. In this case, the controller does not access any previously-stored data regarding the good or bad status of the page.

Figure 10A:
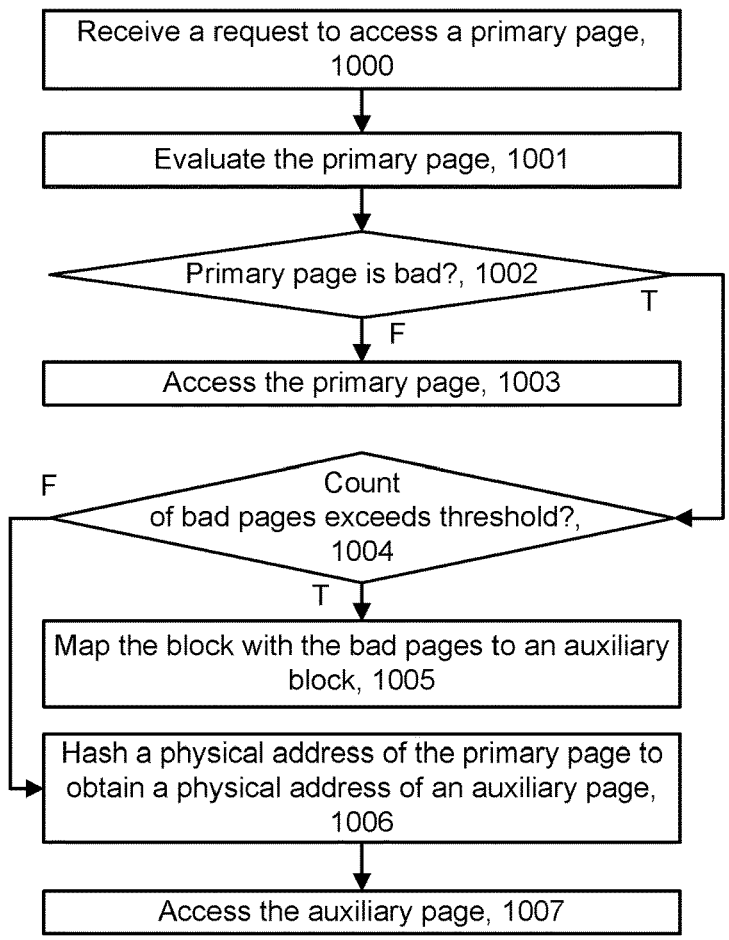
FIG. 10A depicts an example process for remapping bad primary pages to auxiliary pages on a per-page basis if the number of bad pages does not exceed a threshold, or remapping of the entire primary block if the number of bad pages exceeds the threshold.

FIG. 10A depicts an example process for remapping bad primary pages to auxiliary pages on a per-page basis if the number of bad pages does not exceed a threshold, or remapping of the entire primary block if the number of bad pages exceeds the threshold. This approach is efficient because it reduces overhead data by remapping an entire block when appropriate while avoiding excessive block remapping. It provide an optimal tradeoff between storing metadata which identifies the bad pages and the corresponding auxiliary pages, and minimizing the number of auxiliary pages. Step 1000 includes receiving a request to access a primary page. Step 1001 includes evaluating the primary page. See FIG. 9A to 9C for further details. Based on the evaluation, a decision step 1002 determines whether the primary page is bad.

If decision step 1002 is false, the page is good and step 1003 involves accessing the primary page, e.g., for a normal read or write operation which is requested by the host device. In one embodiment, step 1003 is omitted if the evaluation operation determines data states of the cells and the requested access is a read operation. Or, step 1003 may include a read operation for the page if the requested access is a read operation, and if the evaluation operation did not determine the data state of the cells, or the evaluation operation did determine the data states of the cells but did not save the resulting read data.

If decision step 1002 is true, the page is bad and a decision step 1004 determines whether a count of bad pages in the block exceeds a threshold. An example threshold is five pages in a block of 128 pages. If decision step 1004 is false, step 1006 involves hashing a physical address of the primary page to obtain a physical address of an auxiliary page, and step 1007 involves accessing the auxiliary page. Re-hashing can be performed in the case of a collision according to FIG. 8A. If decision step 1004 is true, step 1005 involves mapping the block with the bad pages to an auxiliary block. See, e.g., FIG. 7C. In this case, the logical addresses can be mapped directly to the auxiliary block in place of the primary block. The hashing can be performed in parallel with step 1001, if desired.

Optionally, hashing of address is not used to locate an auxiliary page. Instead, a page in each block can be reserved for metadata which identifies bad pages and the auxiliary pages to which they are remapped. Or, this metadata can be stored in another location. In one approach, steps 1001 and 1002 are omitted if metadata is available which indicates a primary page is bad.

Figure 10B:
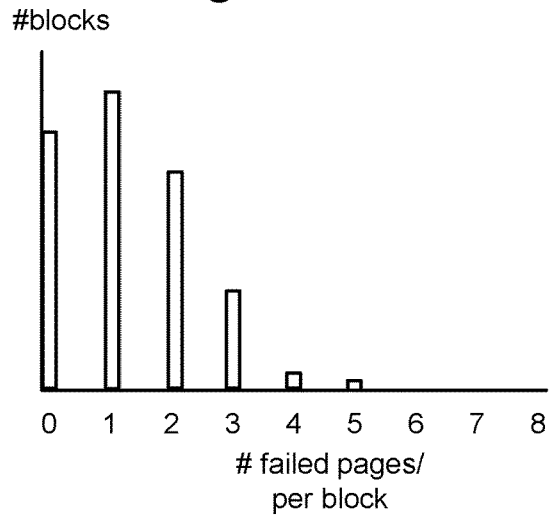
FIG. 10B depicts a number of bad blocks versus a number of failed pages per block, for a population of blocks, showing how the threshold of step 1004 of FIG. 10A can be optimally set.

FIG. 10B depicts a number of bad blocks versus a number of failed pages per block, for a population of blocks, showing how the threshold of step 1004 of FIG. 10A can be optimally set. This histogram indicates that blocks with between 0 and 5 bad pages are fairly common but the number of blocks with more than 5 bad pages is small. Accordingly, a threshold of five blocks is appropriate in step 1004.

Figure 11A:
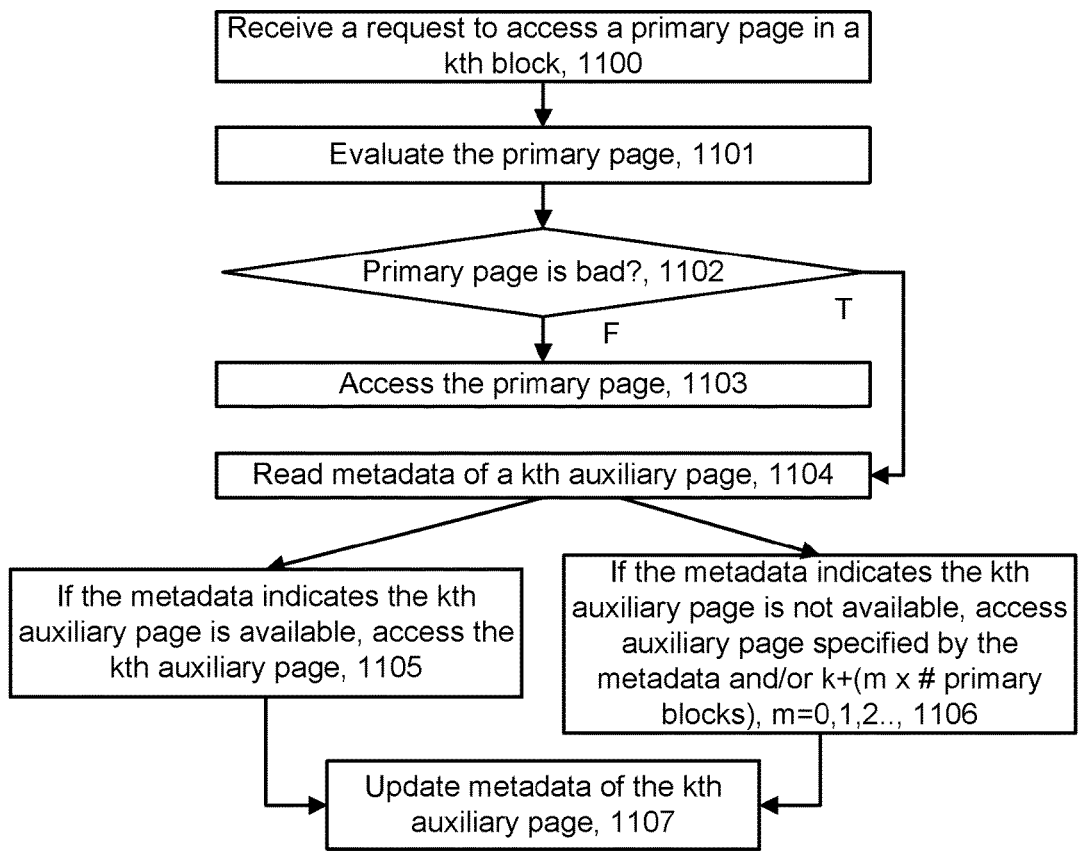
FIG. 11A depicts an example process for remapping bad primary pages in a kth block to auxiliary pages, where metadata is used in an auxiliary page to assist in choosing an auxiliary page for remapping, and a position of the auxiliary page is based on the block identifier, k.

FIG. 11A depicts an example process for remapping bad primary pages in a kth block to auxiliary pages, where metadata is used in an auxiliary page to assist in choosing an auxiliary page for remapping, and a position of the auxiliary page is based on the block identifier, k. By remapping a bad page of a kth block to an auxiliary page which is a function of k, the remapping can proceed more efficiently. The value k may be an integer which represents a position or identifier of a primary block, where first, second, third . . . primary blocks are identified by k=1, 2, 3, . . . . For example, a set of blocks arranged in a row can be numbered with sequential values for k, e.g., block p0, p1, p2 . . . being identified with k=1, 2, 3, . . . , respectively.

In one approach, a table such as in FIG. 7B is used, including the list 700 of auxiliary blocks and pages. The amount of data used to provide the list is reduced with the techniques provided herein because a specific subset of the auxiliary pages is used for remapping of pages of a specific primary block. Further, the hashing of physical addresses of primary pages to physical addresses of auxiliary pages can be omitted in this example.

Step 1100 includes receiving a request to access a primary page in a kth block. For example, the request may include a logical address which is mapped to a physical address in a kth block. Step 1101 includes evaluating the primary page to evaluate whether it is bad, as discussed previously. See FIG. 9A to 9C for further details. If decision step 1102 is false, the page is good and step 1103 involves accessing the primary page, e.g., for a read or write operation which is requested by the host device. In one embodiment, step 1103 is omitted if the evaluation operation determines data states of the cells and the requested access is a read operation. Or, step 1103 may include a read operation for the page if the requested access is a read operation, and if the evaluation operation did not determine the data state of the cells, or the evaluation operation did determine the data states of the cells but did not save the resulting read data.

If decision step 1102 is true, the page is bad and a decision step 1104 includes reading metadata of a kth auxiliary page. This can be in a first auxiliary block s0, in one approach. See FIG. 11B. Subsequently, one of two paths can be followed. In a first path, at step 1105, if the metadata indicates the kth auxiliary page is available, the kth auxiliary page is accessed. For example, the metadata could indicate that no primary page has been remapped to the kth auxiliary page, in which case the primary page can be remapped to the kth auxiliary page. In a second path, at step 1106, if the metadata indicates the kth auxiliary page is not available, an auxiliary page is accessed which is specified by the metadata and/or based on a formula: k+(m×#primary blocks), where m is an integer of zero or more. For example, the metadata could indicate that another primary page has previously been remapped to the auxiliary page. The metadata could also note that a specified number of zero or more pages from the kth block have previously been remapped to other auxiliary pages which are reserved for the kth block. See FIG. 11B for an example.

Step 1107 includes updating the metadata of the kth page. If step 1107 is reached from step 1105, the metadata may be updated to identify the primary page which is mapped to the auxiliary page. If step 1107 is reached from step 1106, the metadata may be updated to identify the number of primary pages which are mapped to other auxiliary pages.

In one approach, steps 1101 and 1102 are omitted if metadata is available which indicates a primary page is bad.

FIG. 11B depicts an example of the remapping of bad primary pages 4, 7 and 15 in a primary block p1 (having an identifier k=1) to an auxiliary page 1 in each of auxiliary blocks s0, s2 and s4, consistent with steps 1105 and 1106 of the process of FIG. 11A. A distance d is a number of pages which separates the auxiliary pages to which primary pages in the kth block are remapped. The page 0 (1450) of block s0 has a user-addressable area 1150a and a reserved area 1150b. Assume page 4 in block p0 is the first page in block p0 which is determined to be bad. Page 4 is remapped to the first available auxiliary page (page 0 in block s0) in a set of auxiliary pages which is reserved for block p0. This set includes page 0 in s0, page 0 in s2, and page 0 in s4.

Assume page 15 in block p0 is the second page in block p0 which is determined to be bad. Page 15 is remapped to the second available auxiliary page (page 0 in block s2) in the set of auxiliary pages which is reserved for block p0. Finally, assume page 7 in block p0 is the third page in block p0 which is determined to be bad. Page 7 is remapped to the third available auxiliary page (page 0 in block s4) in the set of auxiliary pages which is reserved for block p0. In these examples, k=0 is the identifier of block p0. Regarding the formula: k+(m×#primary blocks), assume the number of primary blocks is 256. The formula which identifies an auxiliary page is: k+(m×256). We have m=0 for the first remapped page, page 4, and k=0 is the block index. Accordingly, the formula is 0+(0×256)=0. This represents the first auxiliary page which is page 0 in block s0 (the auxiliary page with page index=0 in FIG. 11C). We have m=1 for the second remapped page, page 15, and k=0 is the block index. Accordingly, the formula is 0+(1×256)=0. This represents the second auxiliary page which is page 0 in block s2 (d=256 pages after page 0 in block s0). This is also the auxiliary page with page index=256 in FIG. 11C. We have m=2 for the third remapped page, page 7, and k=0 is the block index. Accordingly, the formula is 0+(2×256)=512. This represents the third auxiliary page which is page 0 in block s4 (d=256 pages after page 0 in block s2). This is also the auxiliary page with page index=512 in FIG. 11C.

Page 0 of s2 and page 0 of s4 can include metadata of reserved areas 1160 and 1170, respectively, discussed further below.

FIG. 11C depicts a table showing a correspondence between auxiliary blocks and pages and primary blocks, consistent with steps 1105 and 1106 of the process of FIG. 11A and with FIG. 11B. The first column lists the auxiliary blocks s0-s5. The second column lists the page identifier for each block, which ranges from 0-127 in this example. The third column lists a page index, which ranges from 0-767 in this example. Each page is numbered sequentially for a set of successive auxiliary blocks. The fourth column lists the primary blocks which are numbered sequentially from 0-255. The fifth column identifies m, which can be 0, 1 or 2. The table identifies three auxiliary pages which are reserved for each primary block. For example, as noted in FIG. 11B, for block p0 and m=0, 1 or 2, the auxiliary pages are s0, page 0, s2, page 0, and s4, page 0, respectively. For block p127 and m=0, 1 or 2, the auxiliary pages are s0, page 127, s2, page 127, and s4, page 127, respectively. The values for other blocks can be discerned from this information as well. For instance, for block p1 and m=0, 1 or 2, the auxiliary pages are s0, page 1, s2, page 1, and s4, page 1, respectively.

The auxiliary pages which are reserved for a particular kth block are therefore a function of k. In one approach, the auxiliary pages are in a set of auxiliary pages, and the auxiliary pages to which the bad pages of the one block are mapped are separated from one another by an equal number (d) of auxiliary pages.

The table of FIG. 11C does not necessarily have to be created in the memory device. Instead, the formula: k+(m× #primary blocks) can be used to identify the auxiliary pages for a kth block.

As mentioned, the metadata of the reserved area 1150b can be used to indicate whether page 0 of block s0 is available for remapping of a primary page p4. If the page is available, the primary page can be remapped to it and the metadata of the reserved area 1150b can be updated to identify page 4 of block p0. When a second page (page 15) in block p0 is determined to be bad, the controller can read the metadata of the reserved area 1150b to determine that page 0 of block s0 is not available. In one approach, the controller reads the metadata of the next auxiliary page (page 0 of s2) which has been reserved for the block to determine whether the page is available. This is the metadata of the reserved area 1160. If the page is available, the primary page can be remapped to it and the metadata of the reserved area 1160 can be updated to identify page 15 of block p0. If page 0 of s2 is not available, the controller reads the metadata of the next auxiliary page (page 0 of s4) which has been reserved for the block to determine whether the page is available, and so forth. This is the metadata of the reserved area 1170.

In another possible approach, the metadata of the reserved area 1150b of the first auxiliary page for a kth block indicates how many other auxiliary pages have been used in the remapping for the block. For instance, the metadata can identify the value 1 to indicate one other auxiliary page has been used in the remapping for the block. Based on this information, the controller can immediately determine that page 0 of block s4 is the next available auxiliary page for the block. This is true because page 0 of block s0 and s2 are unavailable.

In one approach, the metadata of the reserved area 1150b of the first auxiliary page may keep the count mentioned in step 1004 of FIG. 10A.

Figure 12A:
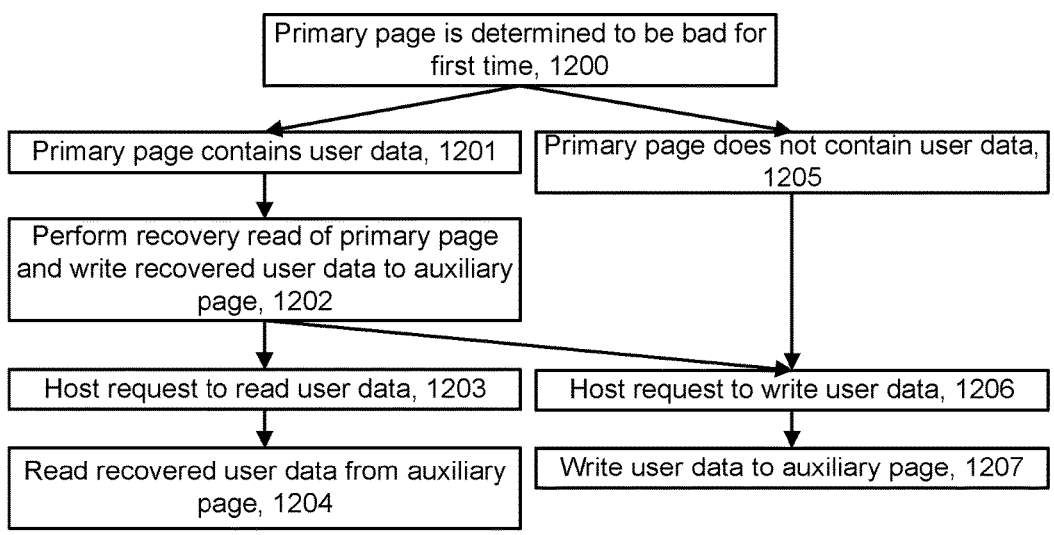
FIG. 12A depicts an example process for accessing a page of data when a primary page is determined to be bad for the first time, consistent with FIG. 8A, step 803 and 806, FIG. 10A, step 1003 and 1007, and FIG. 11A, step 1103.

FIG. 12A depicts an example process for accessing a page of data when a primary page is determined to be bad for the first time, consistent with FIG. 8A, step 803 and 806, FIG. 10A, step 1003 and 1007, and FIG. 11A, step 1103. At step 1200, the primary page is determined to be bad for the first time. Two paths can be followed. In a first path, the primary page contains user data at step 1201. Step 1202 includes performing a recovery read of the primary page and writing the recovered user data to an auxiliary page. In one possible approach, a recovery read can involve multiple sensing operations in which the read voltage is varied incrementally higher and lower compared to the nominal read voltages such as VrA, VrB and VrC in FIG. 6A. A read result which contains no uncorrectable errors may be accepted as the accurate read result. This approach can allow recovery of data even after the Vth distribution has shifted significantly. At step 1203, the host provides a request to read the user data. At step 1204, the recovered user data is read from the auxiliary page. Or, at the host provides a request to write user data at step 1206 and at step 1204, the user data is written to the auxiliary page.

In a second path, the primary page does not contains user data, at step 1205. Data can then be written to the auxiliary page at steps 1206 and 1207 as discussed. The host provides a request to write user data at step 1206. Step 1207 includes writing the user data to the auxiliary page.

Figure 12B:
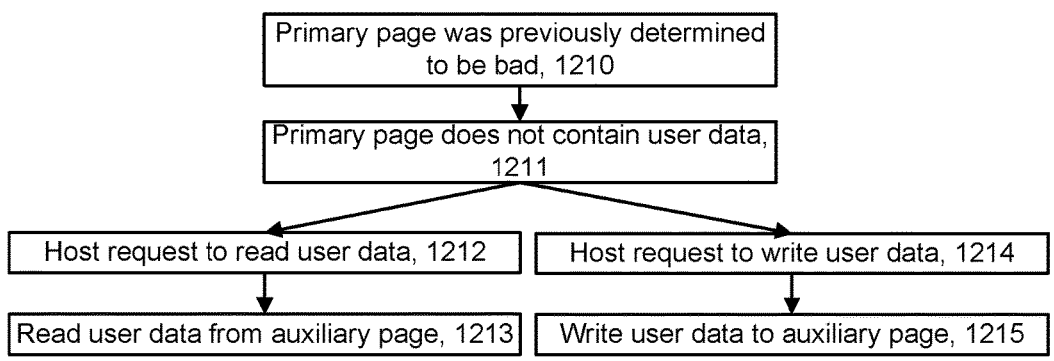
FIG. 12B depicts an example process for accessing a page of data when a primary page was previously determined to be bad, consistent with FIG. 8A, step 803 and 806, FIG. 10A, step 1003 and 1007, and FIG. 11A, step 1103.

FIG. 12B depicts an example process for accessing a page of data when a primary page was previously determined to be bad, consistent with FIG. 8A, step 803 and 806, FIG. 10A, step 1003 and 1007, and FIG. 11A, step 1103. At step 1210, the primary page was previously determined to be bad, e.g., in response to a previous access request by the host such as a read or write request. In this case, step 1211 indicates that the primary page does not contain user data, since any user data would have been recovered and stored in an auxiliary page. Two paths can be followed. In a first path, the host provides a request to read user data at step 1212. Step 1213 includes reading the user data from the previously-assigned auxiliary page. In a second path, the host provides a request to write user data at step 1214. Step 1215 includes writing the user data to the previously-assigned auxiliary page.

Figure 13:
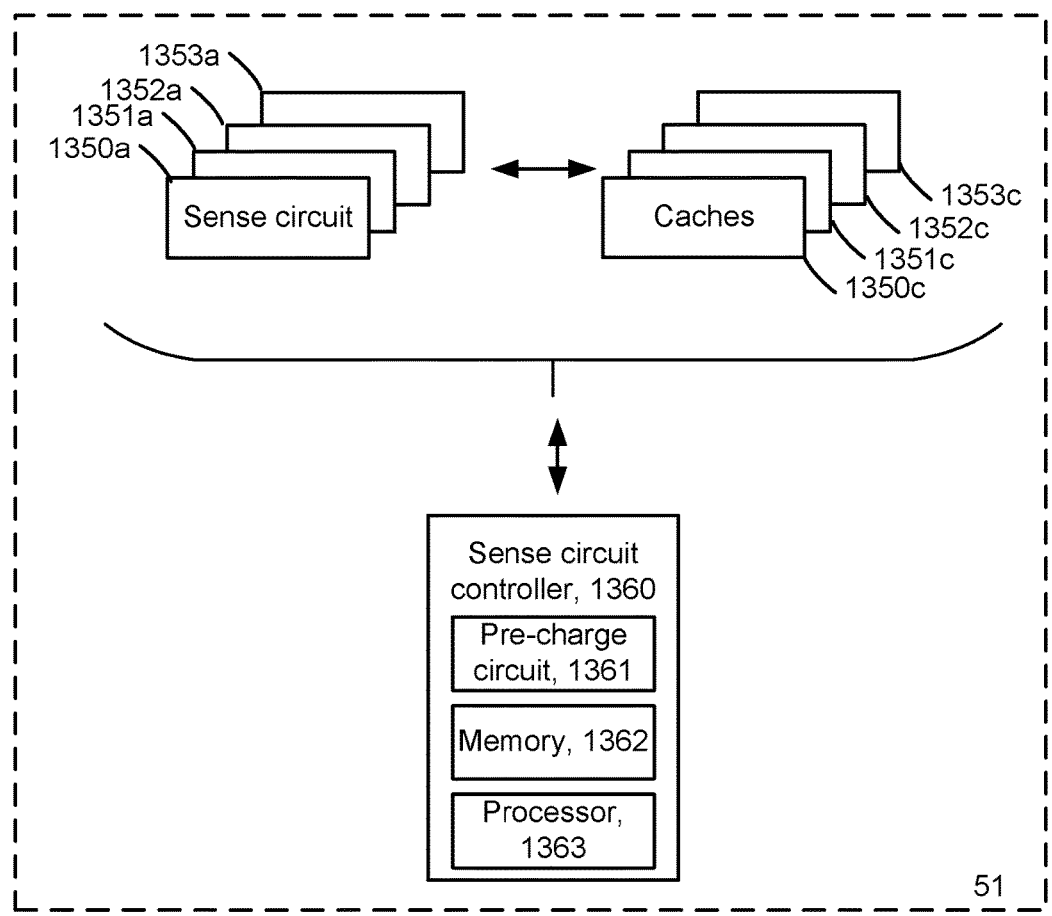
FIG. 13 depicts an example block diagram of a sense block 51 in the column control circuitry of FIG. 1.

FIG. 13 depicts an example block diagram of a sense block 51 in the column control circuitry of FIG. 1. The column control circuitry can include multiple sense blocks, where each sense block performs sensing, e.g., read, program verify or erase verify operations for multiple memory cells via respective bit lines.

In one approach, a sense block comprises multiple sense circuits, also referred to as sense amplifiers. Each sense circuit is associated with data latches and caches. For example, the example sense circuits 1350a, 1351a, 1352a and 1353a are associated with caches 1350c, 1351c, 1352c and 1353c, respectively. The sense circuits are used in writing data to, and reading data from, the primary and auxiliary pages as discussed herein.

In one approach, different subsets of bit lines can be sensed using different respective sense blocks. This allows the processing load which is associated with the sense circuits to be divided up and handled by a respective processor in each sense block. For example, a sense circuit controller 1360 can communicate with the set, e.g., sixteen, of sense circuits and latches. The sense circuit controller may include a pre-charge circuit 1361 which provides a voltage to each sense circuit for setting a pre-charge voltage. The sense circuit controller may also include a memory 1362 and a processor 1363.

Figure 14:
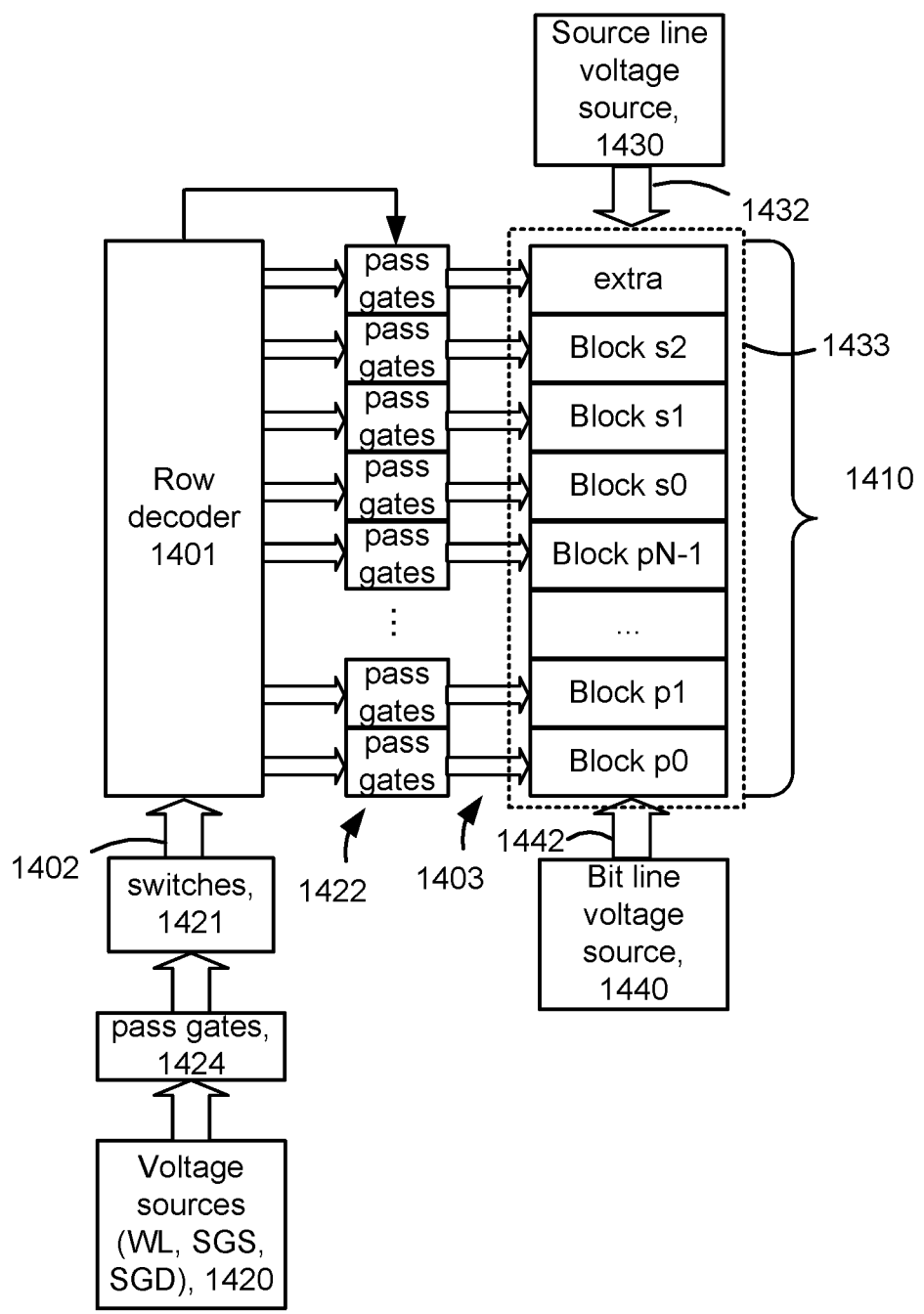
FIG. 14 depicts an example circuit for providing voltages to blocks of memory cells.

FIG. 14 depicts an example circuit for providing voltages to blocks of memory cells. In this example, a row decoder 1401 provides voltages to word lines and select gates of each block in set of blocks 1410. The set could be in a plane and includes primary blocks p0 to pN−1 and auxiliary blocks s0 to s2, consistent with FIG. 1. The row decoder provides a control signal to pass gates 1422 which connect the blocks to the row decoder. Typically, operations, e.g., program, read or erase, are performed on one selected block at a time. The row decoder can connect global control lines 1402 to local control lines 1403. The control lines represent conductive paths. Voltages are provided on the global control lines from voltage sources 1420. The voltage sources may provide voltages to switches 1421 which connect to the global control lines. Pass gates 1424, also referred to as pass transistors or transfer transistors, are controlled to pass voltages from the voltage sources 1420 to the switches 1421.

The voltage sources 1420 can provided voltages on word lines (WL), SGS control gates and SGD control gates, for example.

The various components, including the row decoder, may receive commands from a controller such as the state machine 112 or the controller 122 to perform the functions described herein.

A source line voltage source 1430 provides a voltage to the source lines/diffusion region in the substrate via control lines 1432. In one approach, the source diffusion region 1433 is common to the blocks. A set of bit lines 1442 is also shared by the blocks. A bit line voltage source 1440 provides voltages to the bit lines. In one possible implementation, the voltage sources 1420 are near the bit line voltage source.

In one embodiment, an apparatus comprises: a set of primary pages of memory cells; a set of auxiliary pages of memory cells; an evaluation circuit configured to, in response to each request to access a particular primary page in the set of primary pages, evaluate the particular primary page, and based on the evaluation, determine that the particular primary page is bad; and a hashing circuit configured to hash a physical address of the particular primary page to obtain a physical address of a particular auxiliary page in the set of auxiliary pages, in response to the evaluation circuit determining that the particular primary page is bad.

In another embodiment, an apparatus comprises: means for detecting bad pages in one block of pages; means for mapping the bad pages of the one block of pages to auxiliary pages until a count of the bad pages in the one block of pages exceeds a threshold, until a count of the bad pages in the one block of pages exceeds a threshold, the auxiliary pages to which the bad pages of the one block are mapped are separated from one another by an equal number of auxiliary pages to which bad pages of other blocks are mapped.

In various embodiments, the means for detecting bad page can include the evaluation circuit 119 of FIG. 1, the sense circuits 1350a-1353a of FIG. 13 and the voltage sources 1420 and row decoder 1401 of FIG. 14, or other logic hardware, and/or other executable code stored on a computer readable storage medium. Other embodiments may include similar or equivalent means for transmitting data.

In various embodiments, the means for mapping the bad pages can include the counter 125, the hashing circuit 121 and the collision detecting circuit 123 of FIG. 1, the sense circuits 1350a-1353a of FIG. 13 and the voltage sources 1420 and row decoder 1401 of FIG. 14, or other logic hardware, and/or other executable code stored on a computer readable storage medium. Other embodiments may include similar or equivalent means for transmitting data.

In various embodiments, the means for mapping the one block of pages to one auxiliary block of pages can include the counter 125, the hashing circuit 121 and the collision detecting circuit 123 of FIG. 1, the sense circuits 1350a-1353a of FIG. 13 and the voltage sources 1420 and row decoder 1401 of FIG. 14, or other logic hardware, and/or other executable code stored on a computer readable storage medium. Other embodiments may include similar or equivalent means for transmitting data.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a set of primary pages of memory cells;
a set of auxiliary pages of memory cells;
an evaluation circuit configured to, in response to each request to access a particular primary page in the set of primary pages, evaluate the particular primary page, and based on the evaluation, determine that the particular primary page is bad; and
a hashing circuit configured to hash a physical address of the particular primary page to obtain a physical address of a particular auxiliary page in the set of auxiliary pages, in response to the evaluation circuit determining that the particular primary page is bad.

2. The apparatus of claim 1, wherein:
for one of the requests to access the particular primary page, the evaluation circuit is configured to write metadata to the particular primary page indicating that the particular primary page is bad; and
for subsequent requests to access the particular primary page, the evaluation circuit is configured to read the metadata from the particular primary page to determine that the particular primary page is bad.

3. The apparatus of claim 1, wherein:
the evaluation circuit is configured to decode read data from the evaluation of the particular primary page using an error correction code, and to determine that the particular primary page is bad when the decoded read data comprises an uncorrectable error.

4. The apparatus of claim 1, wherein:
the evaluation circuit is configured to decode read data from the evaluation of the particular primary page, and to determine that the particular primary page is bad when the decoding indicates the read data does not comprise a predetermined bit sequence in a reserved area of the particular primary page.

5. The apparatus of claim 1, further comprising:
a collision detection circuit configured to determine whether another primary page of the set of primary pages is mapped to the particular auxiliary page, wherein the hashing circuit, in response to determining that the another primary page of the set of primary pages is mapped to the particular auxiliary page, is configured to re-hash the physical address of the particular primary page to obtain a physical address of another auxiliary page in the set of auxiliary pages.

6. The apparatus of claim 5, wherein:
the hashing circuit is configured to use a first hashing function in the hash of the physical address of the particular primary page which is different than a second hashing function used in the re-hash of the physical address of the particular primary page;

the first hashing function maps to one set of physical addresses in the set of auxiliary pages; and the second hashing function maps to another set of physical addresses in the set of auxiliary pages and has a smaller range of output values than a range of output values of the first hash function.

7. The apparatus of claim 1, further comprising:

a collision detection circuit configured to read metadata of the particular auxiliary page to determine that the particular primary page has been mapped to the particular auxiliary page, and in response to determining that the particular primary page has been mapped to the particular auxiliary page, allow access to the particular auxiliary page for a read or write operation.

8. The apparatus of claim 1, wherein:

the hashing circuit is configured to hash the physical address of the particular primary page in parallel with the evaluation circuit determining that the particular primary page is bad.

9. The apparatus of claim 1, wherein:

the request to access the particular primary page is made by a host device; and the set of primary pages of memory cells and the set of auxiliary pages of memory cells are in a non-volatile, storage class memory medium.

10. The apparatus of claim 1, wherein:

the request to access the particular primary page comprises a request to write data to the particular primary page; and the evaluation circuit is configured to evaluate the particular primary page in response to the request to write data to the particular primary page.

11. A method, comprising:

in response to a first request to access one primary page in a block of pages, evaluating the one primary page to determine that the one primary page is bad;

in response to determining that the one primary page is bad, remapping a physical address of the one primary page to a physical address of one auxiliary page, the remapping comprises storing metadata in the one auxiliary page which identifies the physical address of the one primary page; and accessing the one auxiliary page.

12. The method of claim 11, wherein:

the remapping of the physical address of the one primary page to the physical address of one auxiliary page occurs without storing metadata linking the physical address of the one primary page to the physical address of the one auxiliary page.

13. The method of claim 11, further comprising:

in response to a request to access another primary page in the block of pages, reading the another primary page to determine that the another primary page is bad and, in response to the determining that the another primary page is bad, hashing a physical address of the another primary page to obtain the physical address of the one auxiliary page, determining that the one auxiliary page is not available to remap data of the another primary page; and in response to the determining that the one auxiliary page is not available to remap the data of the another primary page, hashing the physical address of the another primary page to another auxiliary page.

14. The method of claim 11, further comprising:

in response to a subsequent request to access the one primary page, evaluating the one primary page to again determine that the one primary page is bad; and in response to the again determining that the one primary page is bad, hashing the physical address of the one primary page to obtain the physical address of one auxiliary page.

15. The method of claim 11, wherein:

the metadata is stored in a reserved area of the one auxiliary page.

16. An apparatus, comprising:

means for detecting bad pages in one block of pages; and means for mapping the bad pages of the one block of pages to auxiliary pages until a count of the bad pages in the one block of pages exceeds a threshold, wherein the auxiliary pages to which the bad pages of the one block are mapped, are separated from one another by an equal number of auxiliary pages to which bad pages of other blocks are mapped.

17. The apparatus of claim 16, further comprising:

means for mapping the one block of pages to one auxiliary block of pages when the count of bad pages in the one block of pages exceeds the threshold, the one block of pages comprising the bad pages of the one block and pages of the one block which are not detected as being bad.

18. The apparatus of claim 16, further comprising:

means for storing metadata in a first auxiliary page to which the bad pages of the one block are mapped, the metadata indicates a number of additional auxiliary pages to which the bad pages of the one block are mapped.

19. The apparatus of claim 16, wherein:

the auxiliary pages are in a set of auxiliary pages; and a first auxiliary page to which the bad pages of the one block are mapped has a position in the set of auxiliary pages which is based on an identifier of the one block.

20. The apparatus of claim 16, further comprising:

a set of auxiliary pages comprising metadata, wherein each auxiliary page of the set comprises metadata for a respective block, the metadata identifies auxiliary pages to which the bad pages of the respective block are mapped, and each auxiliary page of the set has a position in the set which is based on an identifier of the respective block.

* * * * *